US007030420B2

(12) United States Patent
Shimomura et al.

(10) Patent No.: US 7,030,420 B2
(45) Date of Patent: Apr. 18, 2006

(54) SWING-TYPE DISPLAY DEVICE

(75) Inventors: Masaru Shimomura, Kyoto (JP); Mikihiro Ishikawa, Kyoto (JP); Hirotaka Uemura, Kyoto (JP); Ryo Fukasawa, Kyoto (JP); Masahiko Ota, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 165 days.

(21) Appl. No.: 10/645,670

(22) Filed: Aug. 22, 2003

(65) Prior Publication Data

US 2004/0222428 A1 Nov. 11, 2004

(30) Foreign Application Priority Data

May 9, 2003 (JP) ............................ 2003-132275

(51) Int. Cl.
*H01L 33/00* (2006.01)
*G08B 5/36* (2006.01)
*G09G 3/14* (2006.01)

(52) U.S. Cl. ............................ 257/88; 257/89; 257/98; 345/31; 345/39; 340/815.45; 340/815.53

(58) Field of Classification Search .................. 257/88, 257/89, 98; 345/31, 39; 340/755, 815.45, 340/815.53

See application file for complete search history.

(56) References Cited

U.S. PATENT DOCUMENTS

| | | | |
|---|---|---|---|
| 4,689,604 A | 8/1987 | Sokol | |
| 4,951,179 A | 8/1990 | Machida | |
| 5,202,675 A | 4/1993 | Tokimoto | |
| 5,363,009 A | 11/1994 | Monto | |
| 5,444,456 A | 8/1995 | Ohta et al. | |
| 5,515,253 A | 5/1996 | Sjobom | |
| 5,548,300 A | 8/1996 | Tokimoto | |
| 5,670,971 A | 9/1997 | Tokimoto | |
| 5,748,157 A | 5/1998 | Eason | |
| 5,800,039 A | 9/1998 | Lee | |
| 5,833,355 A | 11/1998 | You et al. | |
| 5,896,093 A | 4/1999 | Sjobom | |
| 5,903,224 A | 5/1999 | Reynolds | |
| 6,013,987 A | 1/2000 | Platt | |
| 6,072,386 A | 6/2000 | Yu | |
| 6,239,774 B1 | 5/2001 | Altman | |
| 6,243,021 B1 | 6/2001 | Leontieve et al. | |
| 6,249,998 B1 | 6/2001 | NakaMats | |
| 6,265,984 B1 | 7/2001 | Molinaroli | |
| 6,307,527 B1 | 10/2001 | Youngquist et al. | |
| 6,404,409 B1 | 6/2002 | Solomon | |
| 6,433,761 B1 | 8/2002 | Remitz | |
| 6,486,858 B1 | 11/2002 | Altman | |
| 6,567,009 B1 | 5/2003 | Ohishi et al. | |
| 2003/0227425 A1* | 12/2003 | McKay et al. | 345/31 |

* cited by examiner

*Primary Examiner*—David Nelms
*Assistant Examiner*—Long Tran
(74) *Attorney, Agent, or Firm*—Nixon & Vanderhye P.C.

(57) ABSTRACT

A linear array of red LEDs 10R is provided so as to extend in a direction substantially perpendicular to a direction in which a swing-type display device is swung, and a linear array of green LEDs 10G is further provided, the red LEDs 10R and green LEDs 10G being arranged in pairs of two. A CPU activates each of the red LEDs 10R and green LEDs 10G for a predetermined period to emit light in a luminance level in accordance with image data. As a result, an image corresponding to the image data is displayed in the trajectory of the swing due to persistence of vision. Thus, an image can be displayed in various colors.

34 Claims, 21 Drawing Sheets

FIG. 11

| DATA (4bit) | DUTY RATIO [%] | | DISPLAYED COLOR |
|---|---|---|---|
| RED GREEN | RED | GREEN | |
| 00 00 | 0 | 0 | BLACK |
| 00 10 | 0 | 50 | PALE GREEN |
| 00 11 | 0 | 100 | DEEP GREEN |
| 10 00 | 50 | 0 | PALE RED |
| 10 10 | 50 | 50 | PALE ORANGE |
| 10 11 | 50 | 100 | YELLOW |
| 11 00 | 100 | 0 | DEEP RED |
| 11 11 | 100 | 100 | DEEP ORANGE |

SWING-TYPE DISPLAY DEVICE

BACKGROUND

1. Technical Field

The illustrative embodiments relate to a swing-type display device, and more particularly to a swing-type display device incorporating a linear array of a plurality of light-emitting elements, such that each light-emitting element is activated for a predetermined period with a predetermined luminance level as the device itself is swung by a user, whereby an image is displayed in the trajectory of the swing due to persistence of vision.

2. Description of Background Art

Swing-type display devices incorporating an array of plurality of red LEDs (Light Emitting Diodes) are known. As the swing-type display device is swung, the red LEDs flicker with a predetermined pattern, whereby text characters (e.g., "STOP") appear to be formed in the air due to persistence of vision.

However, conventional swing-type display devices, which display images based on flickering red LEDs, can only display text characters or simple diagrams. There is also a problem in that the displayed image may contain stripes associated with the interspaces between the red LEDs.

Therefore, a feature of the illustrative embodiments is to provide a swing-type display device which is capable of displaying images in various colors. Another feature of the illustrative embodiments is to provide a swing-type display device in which the problem of the displayed image containing stripes associated with the interspaces between the light-emitting elements is alleviated.

The illustrative embodiments have the following aspects to attain the features mentioned above. Note that reference numerals and the like are added between parentheses in the below description only for the purpose of facilitating the understanding of the present invention in relation to the below-described embodiments, rather than limiting the scope of the invention in any way.

A swing-type display device according to the illustrative embodiments comprises first light-emitting elements (10R) capable of emitting light in a predetermined color, second light-emitting elements (10G) capable of emitting light in a color which is different from the predetermined color, and a control section (51). A linear array of the first light-emitting elements extends in a direction substantially perpendicular to the direction of the swing. The first light-emitting elements and the second light-emitting elements are arranged in pairs of two, such that each second light-emitting element is disposed near a corresponding one of the first light-emitting elements. The control section activates each of the first and second light-emitting elements for a predetermined period (T) to emit light in a luminance level in accordance with image data. Thus, when the swing-type display device is swung, an image corresponding to the image data is displayed in the trajectory of the swing. Thus, by employing at least two kinds of light-emitting elements emitting light of different colors from one another, it becomes possible to display images in various colors, beyond the capabilities of conventional swing-type display devices. By employing three kinds of light-emitting elements emitting light of different colors from one another, it becomes possible to display images in even more colors than in the case of employing two kinds of light-emitting elements. Note that the image data may include data representing text characters.

Typically, the predetermined period is equal to a period for displaying a single pixel of the image. Thus, lines (e.g., lines 1 to 8 in FIG. 6) constituting the image are consecutively displayed in the trajectory of the swing motion of the swing-type display device, so that the entire image appears in the trajectory of the swing due to persistence of vision.

Preferably, the first and second light-emitting elements of each pair are located side by side in the direction of the swing (FIG. 1). Thus, the trajectory of the first light-emitting elements and the trajectory of the second light-emitting elements when the swing-type display device is swung coincide with each other, thereby enabling proper displaying of the image. Furthermore, the control section may control one of the first and second light-emitting elements of each pair that is located more to a rear along the direction of the swing of the swing-type display device to be activated a predetermined time ($\Delta t$ in FIG. 15B) later than the other light-emitting element which is located more to a front along the direction of the swing of the swing-type display device. Thus, it is ensured that the position at which a first light-emitting element is activated to display a given pixel coincides with the position at which a corresponding second light-emitting element is activated to display the same pixel, thereby enabling proper displaying of the image. Such a structure is effective in the case where the first and second light-emitting elements constituting each pair are widely spaced apart, or where the light-emitting elements are mounted on the swing-type display device without any covering means thereon.

The tilt sensor may further comprise an optical guide (20) for allowing the light emitted from the first and second light-emitting elements to propagate therethrough to outside of the swing-type display device. Preferably, the optical guide includes a face, oriented toward the outside of the swing-type display device, which is matte-finished to diffuse the light propagating through the optical guide (FIG. 2A). Thus, the light from the first and second light-emitting elements of each pair is adequately diffused, thereby rendering the stripes appearing in the displayed image due to the interspaces between the light-emitting elements less conspicuous (FIG. 3B). Preferably, a groove (201) is formed on the first face of the optical guide, in a position opposing each of boundaries between adjacent pairs of first and second light-emitting elements. Thus, the light output from a given pair of light-emitting elements can be prevented from propagating through the optical guide to the neighborhood of another pair of light-emitting elements.

The control section may drive each of the first and second light-emitting elements for the predetermined period by PWM technique using a pulse having a frequency based on the image data ((a1) to (a3) of FIG. 12). By using a pulse whose frequency takes at least two values in accordance with the image data, not only are the light-emitting elements activated or deactivated, but the luminance of the activated light-emitting elements is varied in accordance with the image data, thereby enabling a display in a greater variation of colors. Alternatively, the control section may drive each of the first and second light-emitting elements for the predetermined period with a current or voltage based on the image data ((b1) to (b3) in FIG. 12). In this case, too, by using a current or voltage which can take two values in accordance with the image data, the luminance of the activated light-emitting elements is varied in accordance with the image data, thereby enabling a display in a greater variation of colors.

The swing-type display device may further comprise a tilt sensor (30) for detecting a tilt of the swing-type display device, the tilt sensor including a ball (301) which is capable of reciprocating between a first position (FIG. 4A) and a second position (FIG. 4B) in synchronization with the swing of the swing-type display device. The control section may begin activating each of the first and second light-emitting elements each time the ball is moved out of the first (FIG. 8A) or second position (FIG. 9A). Thus, an image can be displayed at an appropriate position in the trajectory of the swing by using a simple structure.

Another swing-type display device according to the illustrative embodiments comprises: a linear array of light-emitting elements, the linear array extending in a direction substantially perpendicular to the direction of the swing, a control section (51), partitions (80), and a covering member (70) composed of a light-transmitting material. The control section activates each of the light-emitting elements for a predetermined period to emit light in a luminance level in accordance with image data. Each partition is disposed between light-emitting elements, thereby restricting the directions in which the light output from the light-emitting surfaces of the light-emitting elements can travel. With such partitions, it is possible to adjust the regions of the covering member which is struck by the light. The covering member is provided to cover the light-emitting elements and the partitions, the covering member being composed of a light-transmitting material. A plurality of convex portions (701) are formed on the covering member, each shaped as a ridge extending along the direction of the swing. The convex portions refract the light from the light-emitting elements (which are point sources) so as to exit the covering member. As a result, a uniform luminance can be obtained within the light-outgoing surface of the covering member (i.e., the face of the covering member via which light goes out) while minimizing the decrease in luminance. As a result, pixel-to-pixel stripes can be made hardly noticeable.

Preferably, the convex portion has a lenticular-lens-like or wedge-like configuration (as shown at 701 in FIG. 20). By forming such convex portions, it becomes possible to obtain an even more uniform luminance within the light-outgoing surface of the covering member (see FIGS. 19A, 19B and 20).

A plurality of said partitions may be formed in a light-emitting area on the second face which is attributable to each of the light-emitting elements. By forming the convex portions in such positions, the colors of adjoining pixels are adequately intermixed by the action of the convex portions present between pixels, thereby enabling a more thorough elimination of stripes (see FIGS. 19A, 19B, 20, and 21C).

A plurality of convex portions (701) may be formed in a light-emitting area on the face of the covering member which is attributable to each of the light-emitting elements, and the covering member may be disposed so as to leave a predetermined space from the partitions (80) (FIG. 19B). Thus, since the light output from the light-emitting elements overrides the partitions to an adequate extent, the stripes appearing in the displayed image due to the interspaces between the light-emitting elements are rendered even less conspicuous. Furthermore, the covering members may be formed at least on portions of the first face opposing the partitions. (see dotted lines in FIGS. 19B and 20). Thus, the light overriding the partitions is refracted so as to be output in a direction perpendicular to the light-emitting surfaces of the light-emitting elements, thereby rendering the stripes in the displayed image even less conspicuous.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is an exemplary table to be referred to when generating pulses based on image data;

DESCRIPTION OF NON-LIMITING EXEMPLARY EMBODIMENTS

Hereinafter, various embodiments of the present invention will be described with reference to the accompanying figures.

First Embodiment

A first embodiment of the present invention will be described. A major feature of the first embodiment is the ability to display multiple colors by employing two colors of LEDs and individually varying the luminance levels of the LEDs.

Figure 1:
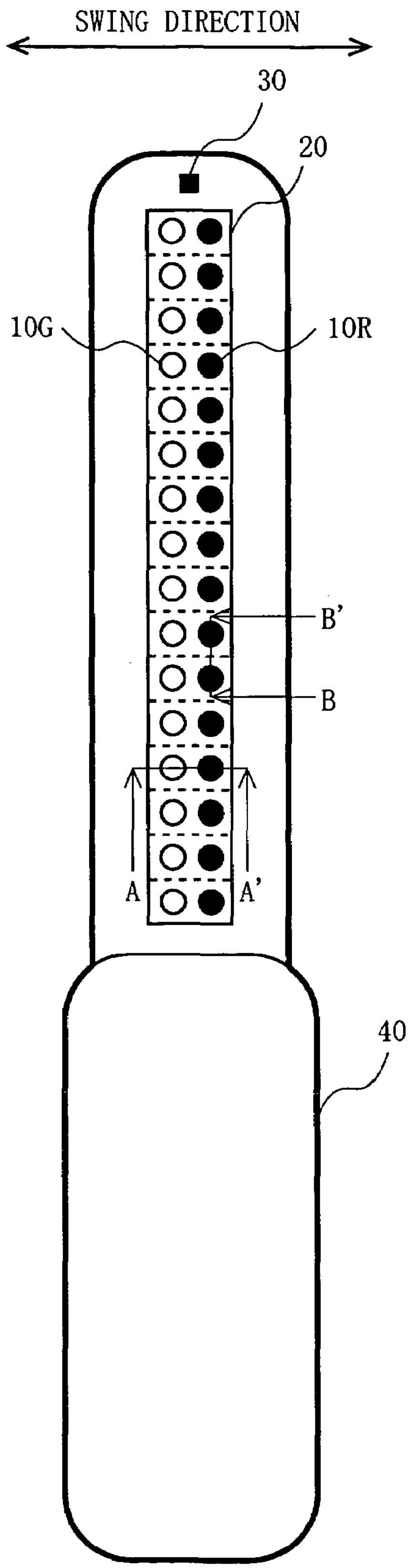
FIG. 1 is an external view showing a swing-type display device according to a first embodiment of the present invention.

FIG. 1 is an external view showing a swing-type display device according to a first embodiment of the present invention. As shown in FIG. 1 the swing-type display device comprises sixteen red LEDs 10R, sixteen green LEDs 10G, an optical guide 20, a tilt sensor 30, and a grip portion 40. The red LEDs 10R are arranged in a linear array which is substantially perpendicular to a swing direction (i.e., a direction in which the swing-type display device is swung) shown in FIG. 1. The red LEDs and the green LEDs are grouped into pairs of two, such that each green LED 10G is located near a corresponding red LED 10R.

In the present embodiment, as shown in FIG. 1, the red LED 10R and the green LED 10G in each pair are located side by side along the swing direction. This arrangement provides an advantage in that the trajectory of the red LED 10R matches that of the green LED 10G when the swing-type display device is swung, thereby resulting in proper displaying of an image. However, the present invention is not necessary limited thereto. For example, the red LED 10R and the green LED 10G in each pair may be located side by side along a direction perpendicular to the swing direction.

The optical guide 20, which is composed of a light-transmitting material such as acrylic resin, is disposed so as to cover light-emitting surfaces of the red LEDs 10R and the green LEDs 10G. The optical guide 20 serves to propagate the light which has been output from the light-emitting surfaces of the LEDs 10R and 10G, so as to be allowed outside of the swing-type display device.

Figure 2A:
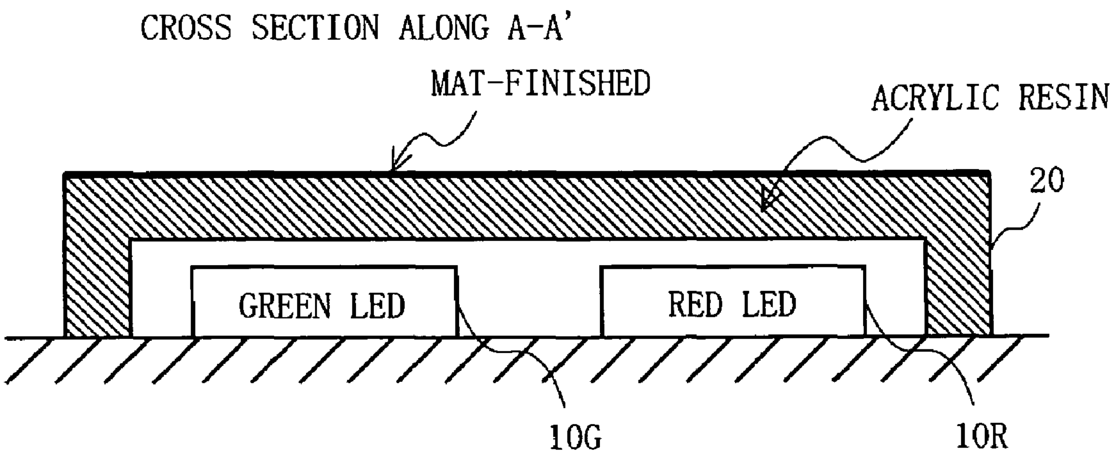
FIGS. 2A and 2B are cross-sectional views illustrating the swing-type display device according to the first embodiment.

Referring to FIG. 2A, cross sections taken at line A–A' and line B–B' in FIG. 1 will be described.

Figure 3A:
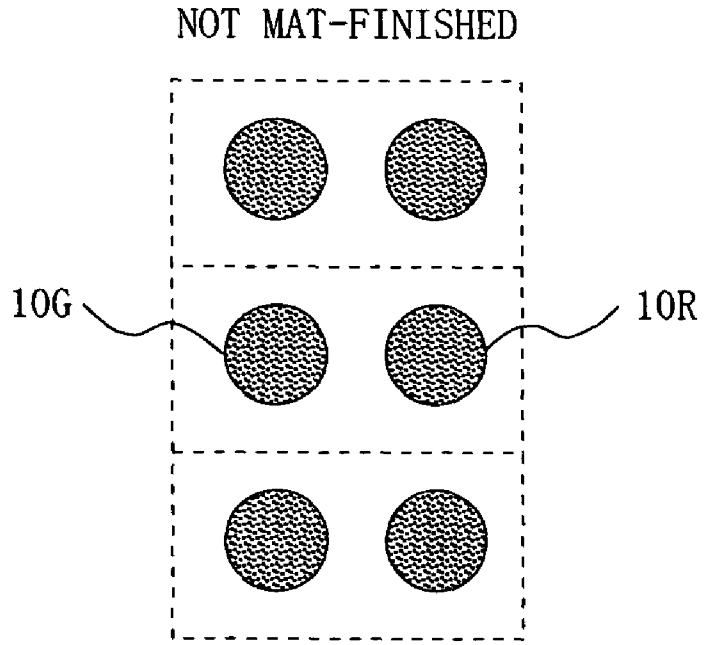
FIGS. 3A and 3B are diagrams illustrating the effects of matte finishing.
Figure 3B:
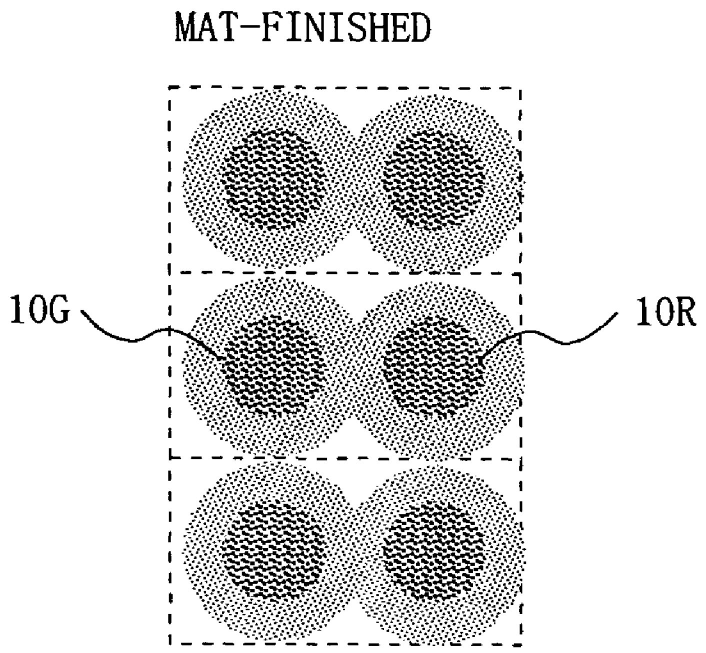

As shown in FIG. 2A, the red LED 10R and the green LED 10G in each pair are located side by side along the swing direction. The optical guide 20 is disposed so as to cover the light-emitting surfaces of the red LED 10R and the green LED 10G. The outer surface of the optical guide 20 is matte-finished, i.e., made coarse, in order to allow the light propagating through the optical guide 20 to be appropriately diffused on the outer surface of the optical guide 20, and consequently render the stripes, if any, which may appear in the displayed image due to the interspaces between the LEDs 10R and 10G, less conspicuous. For example, if no optical guide 20 is provided, or if an optical guide 20 is provided without being mat-finished on the surface, the interspaces between the LEDs will appear dark as shown in FIG. 3A. On the other hand, as shown in FIG. 3B, the interspaces between the LEDs will appear slightly brighter if the surface of the optical guide 20 is matte-finished. However, the inner surface of the optical guide 20 is not matte-finished, i.e., left smooth, so as to facilitate the entrance of the light output from the red LEDs 10R and the green LEDs 10G.

Figure 2B:
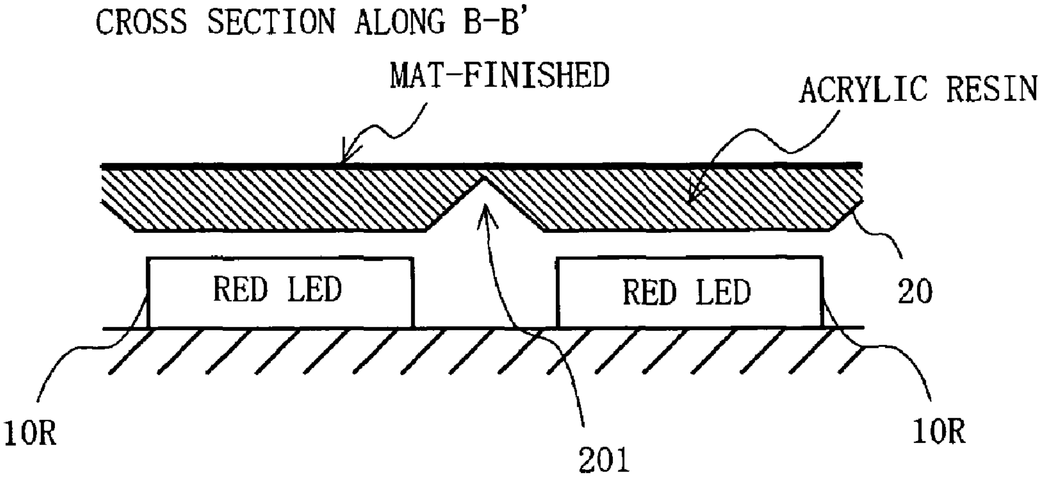

As shown in FIG. 2B, on the inner surface of the optical guide 20, a groove extending along the swing direction is formed in a portion opposing a boundary between the red LED 10R and the green LED 10G composing each pair. A plurality of such grooves 201 are provided in the swing-type display device (only one of the grooves 201 is shown in FIG. 2B). The grooves 201 prevent the light output from the LEDs of a given pair from propagating, through the optical guide 20, to the neighborhood of the LEDs of another pair.

The tilt sensor 30 may be a generic sensor which can be employed for general tilt detection purposes. Note, however, that according to the present embodiment, the tilt sensor 30 is not employed for detecting a tilt of the swing-type display device, but for detecting in which direction the swing-type display device is being swung, or for determining the activation timing of the LEDs 10R and 10G.

Figure 4A:
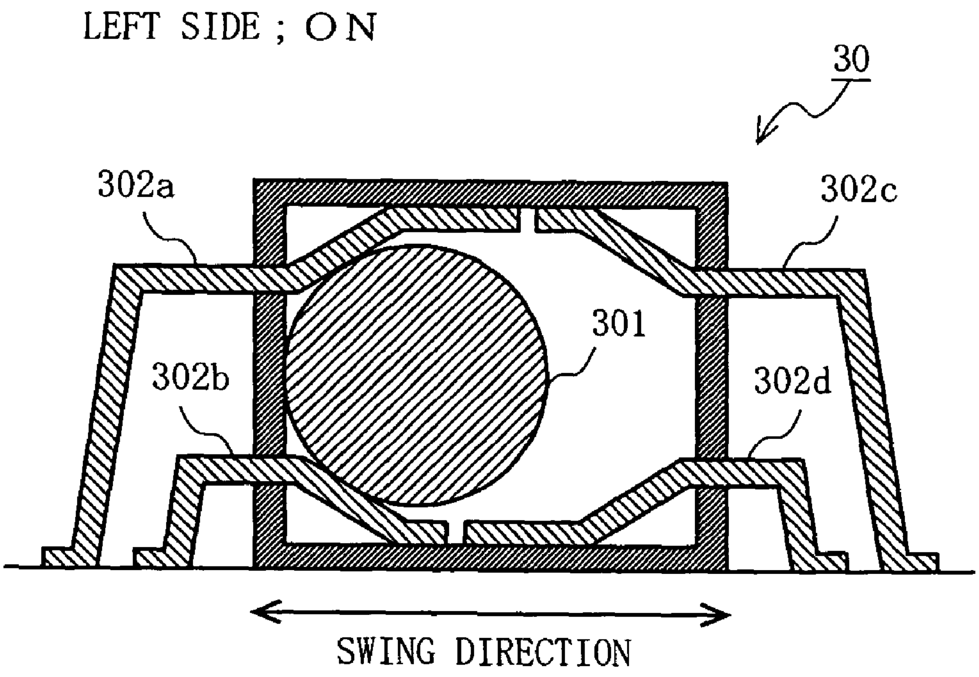
FIGS. 4A and 4B are cross-sectional views illustrating a tilt sensor.
Figure 4B:
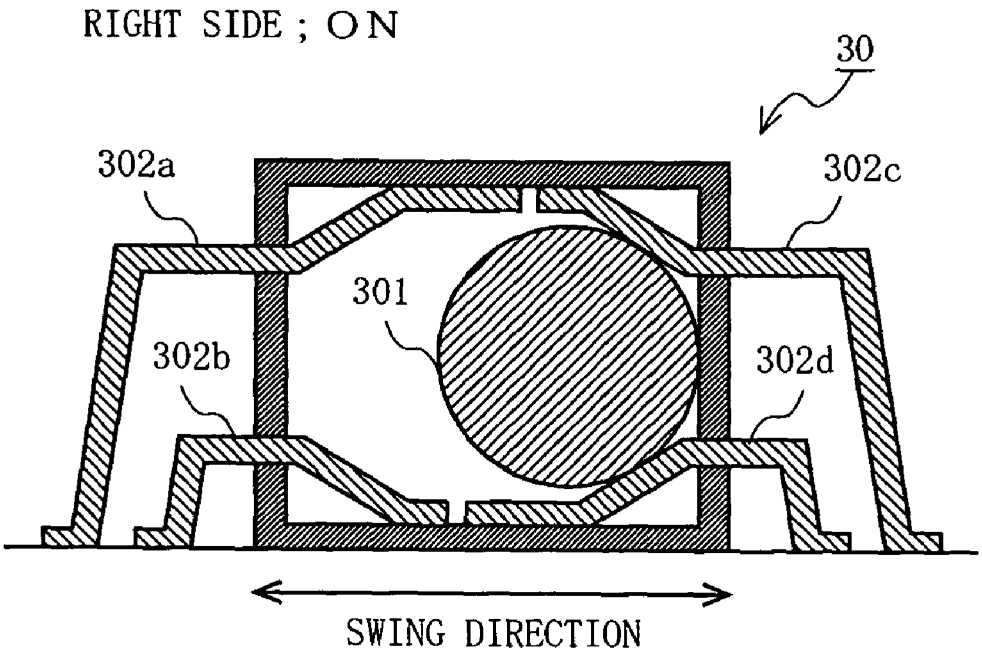

Referring to FIGS. 4A and 4B, the structure of the tilt sensor 30 will be described. As shown in FIGS. 4A and 4B, the tilt sensor 30 comprises a ball 301 at least whose surface is electrically conductive, and four terminals 302*a*, 302*b*, 302*c*, and 302*d*. The ball 301 is able to move, toward the right or left within the tilt sensor 30, in synchronization with a swinging motion of the swing-type display device. As used herein, referring to FIG. 1, the "right" direction is defined as the side on which each green LED 10G is disposed, whereas the "left" direction is defined as the side on which each green LED 10G is disposed. In the tilt sensor 30, when the ball 301 moves flush to the left, electrical conduction occurs between the terminals 302*a* and 302*b* as shown in FIG. 4A; when the ball 301 moves flush to the right, electrical conduction occurs between the terminals 302*c* and 302*d* as shown in FIG. 4B.

Next, referring to FIG. 5, the internal structure of the swing-type display device will be described. In the swing-type display device, a CPU 51, a ROM 61, the tilt sensor 30, LED driving buffers B1, B2, . . . , Bn, the red LEDs 10R, and the green LEDs 10G are electrically connected in the manner shown in FIG. 5.

Figure 6:
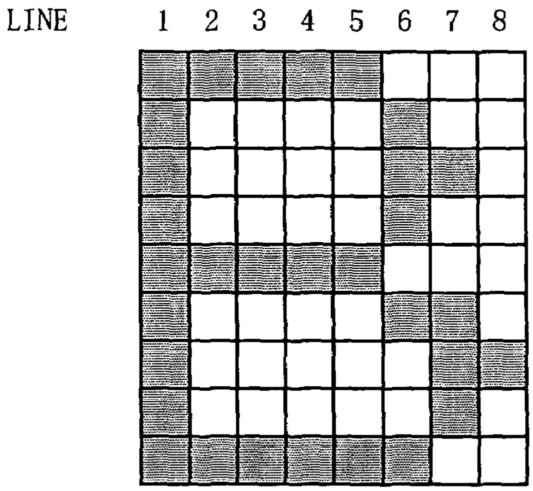
FIG. 6 is a diagram illustrating an exemplary image data to be stored in a ROM 61.

The ROM 61 stores image data corresponding to an image to be displayed, such as that shown in FIG. 6. The image data stored in the ROM 61 is composed of a plurality of lines (eight such lines are shown in FIG. 6), each line being composed of a plurality of pixels. Although the image data exemplified in FIG. 6 is sized 9×8 pixels, the present invention is not limited thereto.

Figure 7:
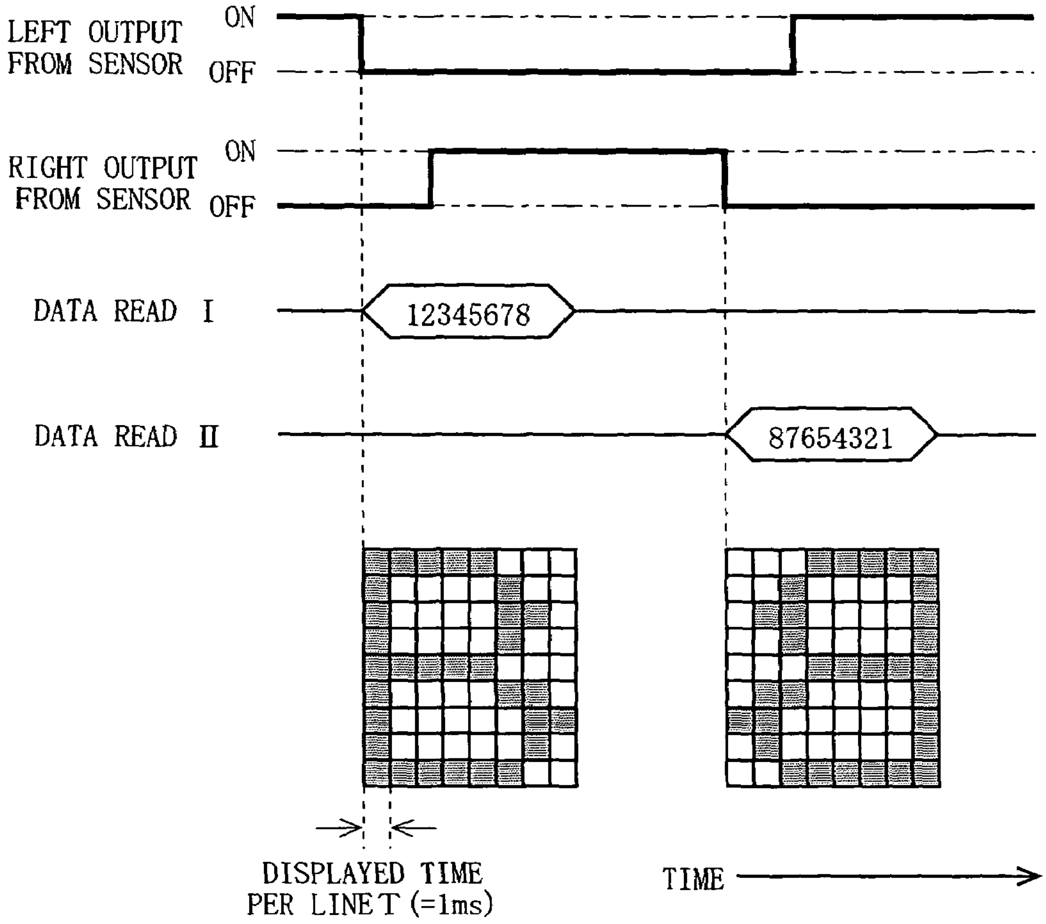
FIG. 7 is a diagram illustrating the read timing of image data.

Based on an output from the tilt sensor 30, the CPU 51 sequentially reads the image data stored in the ROM 61, line by line. More specifically, as shown in FIG. 7, the CPU 51 begins reading the image data when the left output of the tilt sensor 30 transitions from ON (i.e., electrical conduction exists between the terminals 302*a* and 302*b*) to OFF (i.e., no electrical conduction exists between the terminals 302*a* and 302*b*), that is, when the ball 301 moves out of the position shown in FIG. 4A. At this time, the image data is read from line 1 to line 8, as indicated in "data read I" in FIG. 7. On the other hand, the CPU 51 also begins reading the image data when the right output of the tilt sensor 30 transitions from ON (i.e., electrical conduction exists between the terminals 302*c* and 302*d*) to OFF (i.e., no electrical conduction exists between the terminals 302*c* and 302*d*), that is, when the ball 301 moves out of the position shown in FIG. 4B. At this time, the image data is read from line 8 to line 1, as indicated in "data read II" in FIG. 7. The reading cycle for the image data is T (e.g., 1 ms), so that one line of image data is sequentially read for every period of T.

Figure 8A:
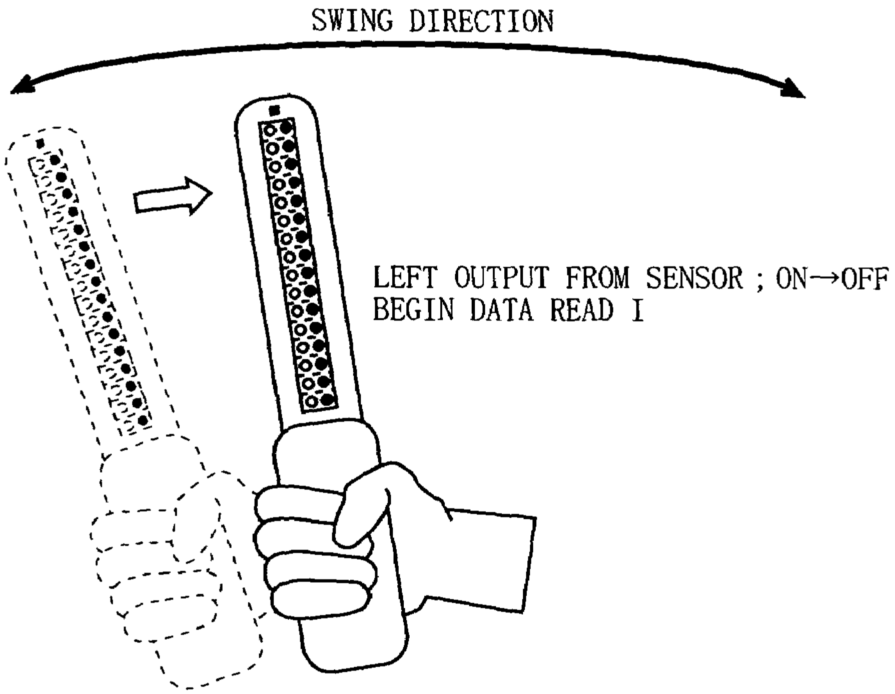
FIGS. 8A and 8B are views illustrating the display timing of image data when the swing-type display device is swung to the right.
Figure 8B:
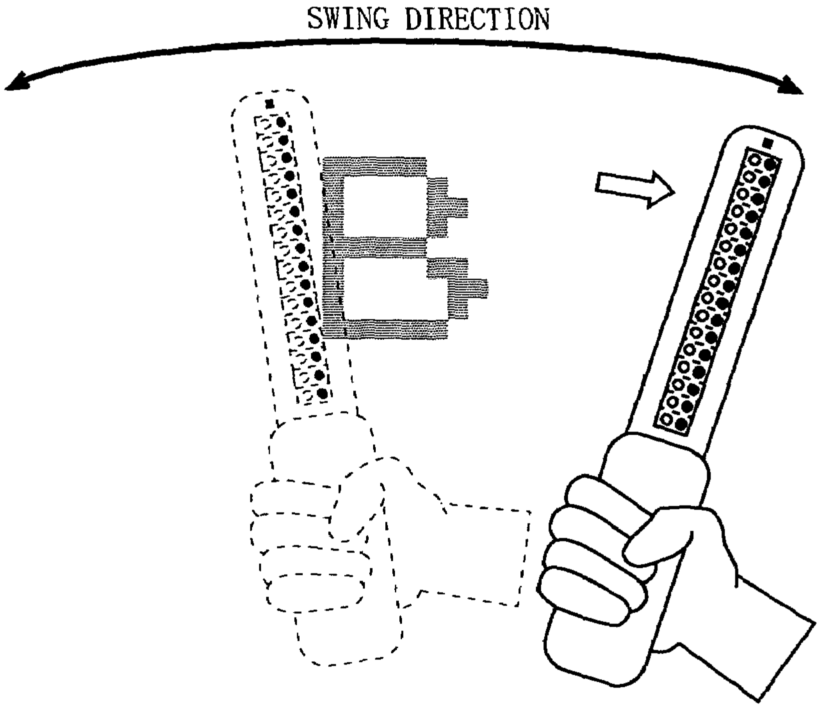

The user swings the swing-type display device by applying alternating accelerations in the right or left direction to the swing-type display device. The point in time at which the ball 301 moves out of the position shown in FIG. 4A corresponds to the point in time at which the user stops accelerating the swing-type display device in the right direction. More specifically, immediately after the user has swung the swing-type display device all the way to the left, the ball 301 is positioned as shown in FIG. 4A. Thereafter, the user reverses the swing direction and begins swinging the swing-type display device in the right direction, and a period of time will follow during which an acceleration in the right direction keeps being applied to the swing-type display device, so that the ball 301 stays in the position shown in FIG. 4A. As the swing-type display device is moved more to the right, the force applied by the user to swing the swing-type display device to the right will be gradually decreased, so that the acceleration applied to the swing-type display device in the right direction will also decrease accordingly. As a result, the ball 301 moves out of the position shown in FIG. 4A at a point in time illustrated in FIG. 8A. At the point illustrated in FIG. 8A, the CPU 51 sequentially reads image data from line 1, and generates and outputs pulses (P1-*r*, P1-*g*, P2-*r*, P2-*g*, . . . , Pn-r, and Pn-g in FIG. 5) for driving the LEDs 10R and 10G based on this image data. As a result, as shown in FIG. 8B, an image corresponding to the image data is displayed in the trajectory of the swing for a brief moment.

Figure 9A:
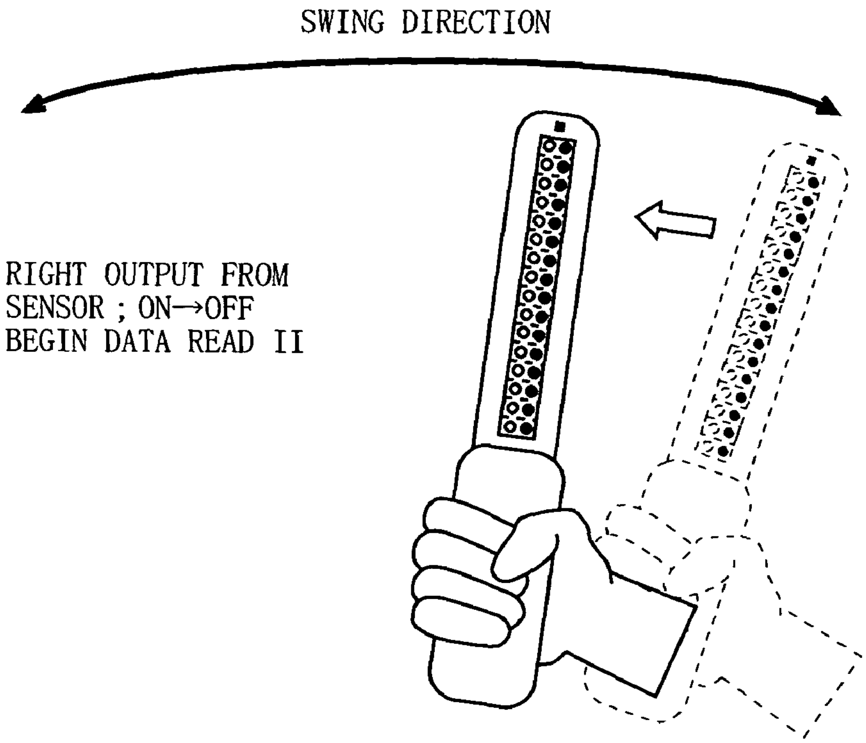
FIGS. 9A and 9B are views illustrating the display timing of image data when the swing-type display device is swung to the left.
Figure 9B:
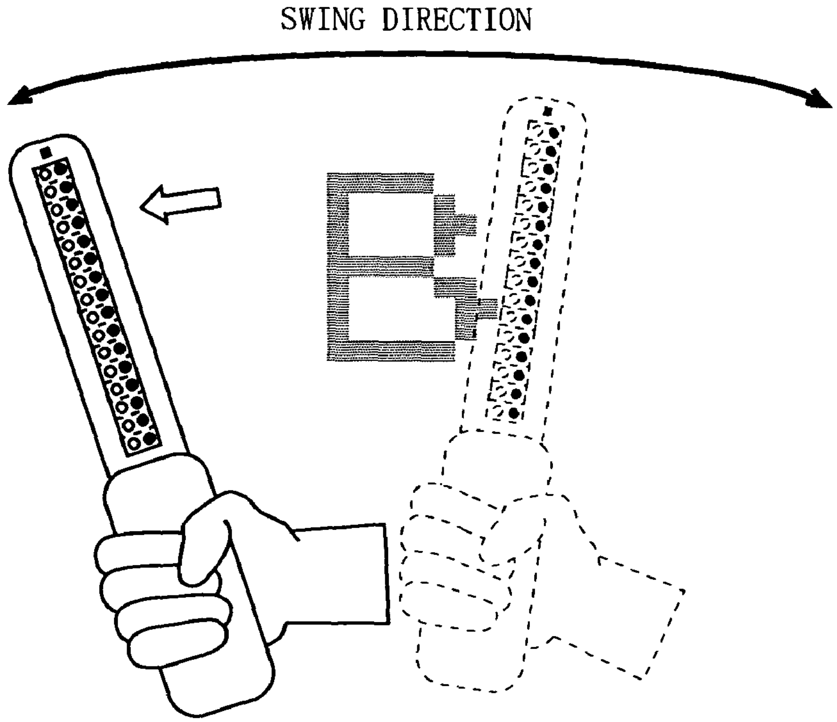

Similarly, the point in time at which the ball 301 moves out of the position shown in FIG. 4B corresponds to the point in time at which the user stops accelerating the swing-type display device in the left direction, which is illustrated in FIG. 9A. At the point illustrated in FIG. 9A, the CPU 51 sequentially reads image data from line 8, and generates and outputs pulses for driving the LEDs 10R and 10G based on this image data. As a result, as shown in FIG. 9B, an image corresponding to the image data is displayed in the trajectory of the swing for a brief moment.

Figure 10:
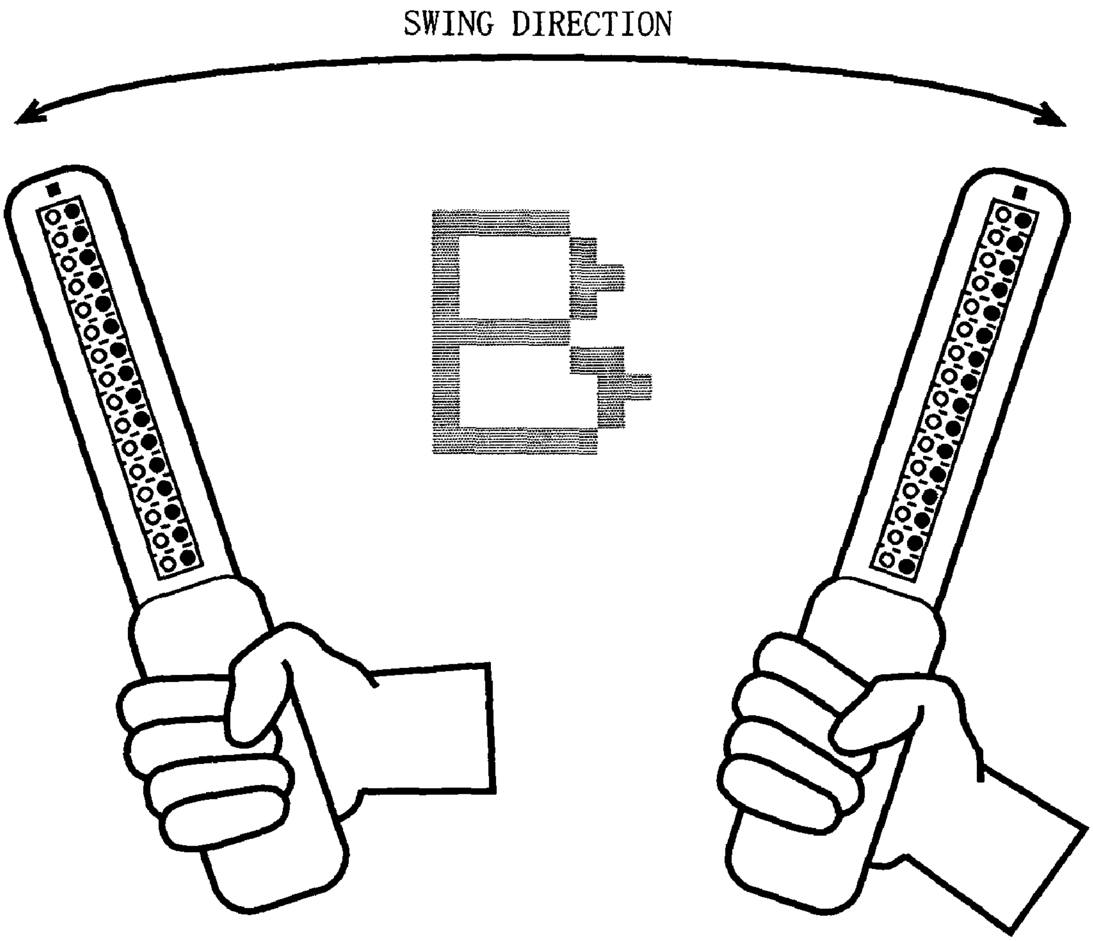
FIG. 10 is a view showing an exemplary image to be displayed in the trajectory of the swing.

Thus, the same image is displayed when the swing-type display device is swung right or left. As a result, by swinging the swing-type display device alternately to the right or the left, an image is displayed in the trajectory of the swing due to persistence of vision, as shown in FIG. 10.

In the present embodiment, it is assumed that each pixel of the image data is 4 bits in size. By individually controlling the red LEDs 10R and the green LEDs 10G based on this image data, the CPU 51 can display various images containing colors such as red, green, yellow, orange, and the like. More specifically, a table showing correspondence between data and duty ratios such as that shown in FIG. 11 is prepared in advance, and based on this table, the CPU 51 generates and outputs pulses having duty ratios corresponding to the data of the respective pixels. The table shown in FIG. 11 is only exemplary. For example, each pixel of the image data may be 3 bits in size. Moreover, four duty ratios (e.g., 0%, 33%, 66%, or 100%) may be used for each of red and green pixel.

Figure 12:
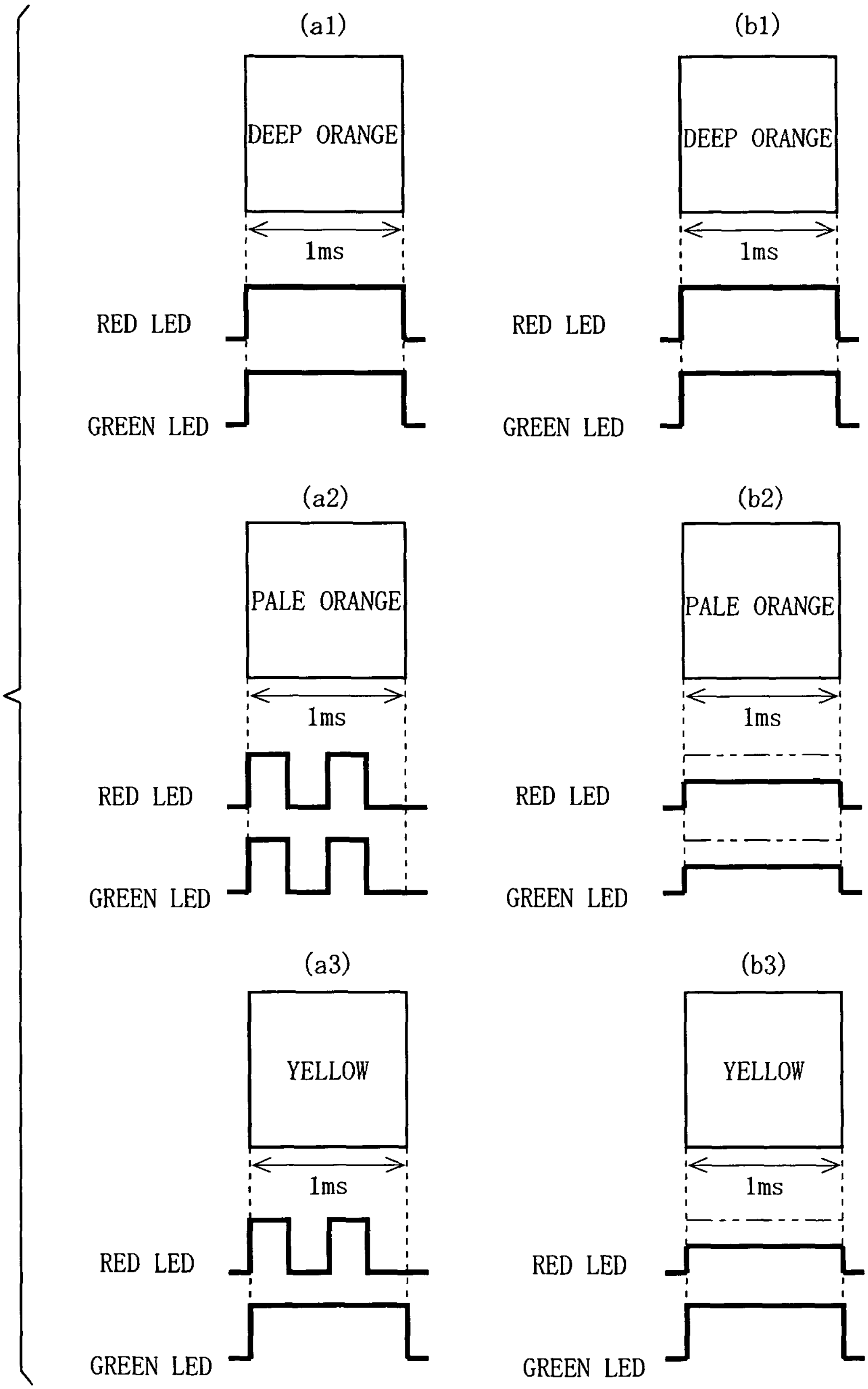
FIG. 12 is a set of diagrams illustrating exemplary manners of driving a red LED and a green LED.

For example, if a given pixel has the data "1111", the CPU 51 provides a pulse having a duty ratio of 100% to the red LED 10R corresponding to this pixel, and also provides a pulse having a duty ratio of 100% to the green LED 10G corresponding to this pixel, as shown in (a1) of FIG. 12. Accordingly, the red LED 10R and the green LED 10G are activated to emit light at a high luminance level. As a result, a deep red color displayed by the red LED 10R and a deep green color displayed by the green LED 10G are mixed, resulting in a deep orange color being displayed in the trajectory of the swing.

If a given pixel has the data "1010", the CPU 51 provides a pulse having a duty ratio of 50% to the red LED 10R corresponding to this pixel, and also provides a pulse having a duty ratio of 50% to the green LED 10G corresponding to this pixel, as shown in (a2) of FIG. 12. As a result, a pale orange color is displayed in the trajectory of the swing. Similarly, for a given pixel having the data "1011", a yellow color is displayed in the trajectory of the swing as shown in (a3) of FIG. 12.

Although the present embodiment illustrates an example where a PWM (Pulse Width Modulation) technique is used to drive the LEDs 10R and 10G, the present invention is not limited thereto. For example, as shown in (b1), (b2) and (b3) of FIG. 12, similar displaying can also be attained by varying the value of the voltage or current to be applied to the LEDs 10R and 10G according to the image data.

Figure 13:
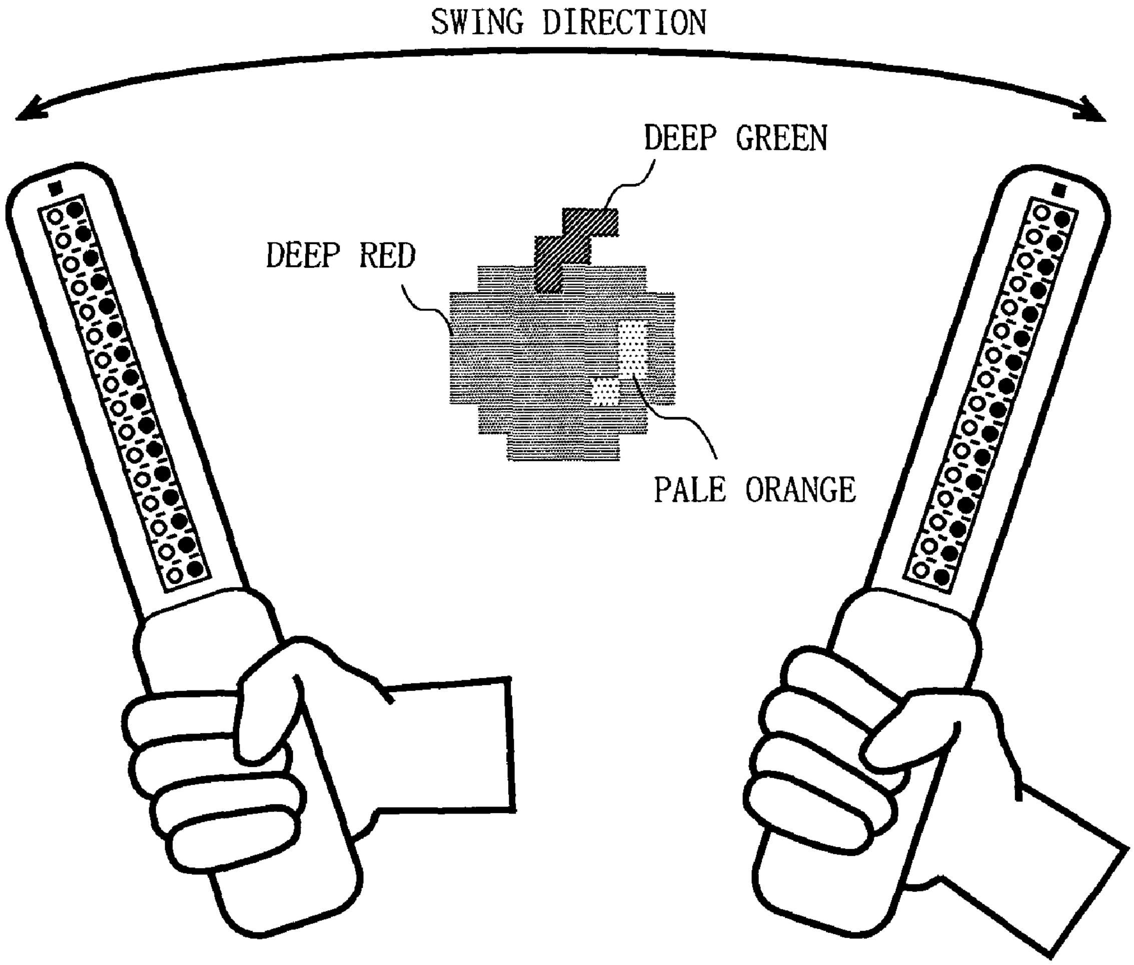
FIG. 13 is a view showing an exemplary image to be to be displayed in the trajectory of the swing.

Through the above-described process, the swing-type display device according to the present embodiment can display an image in multiple colors, as exemplified in FIG. 13.

Figure 14:
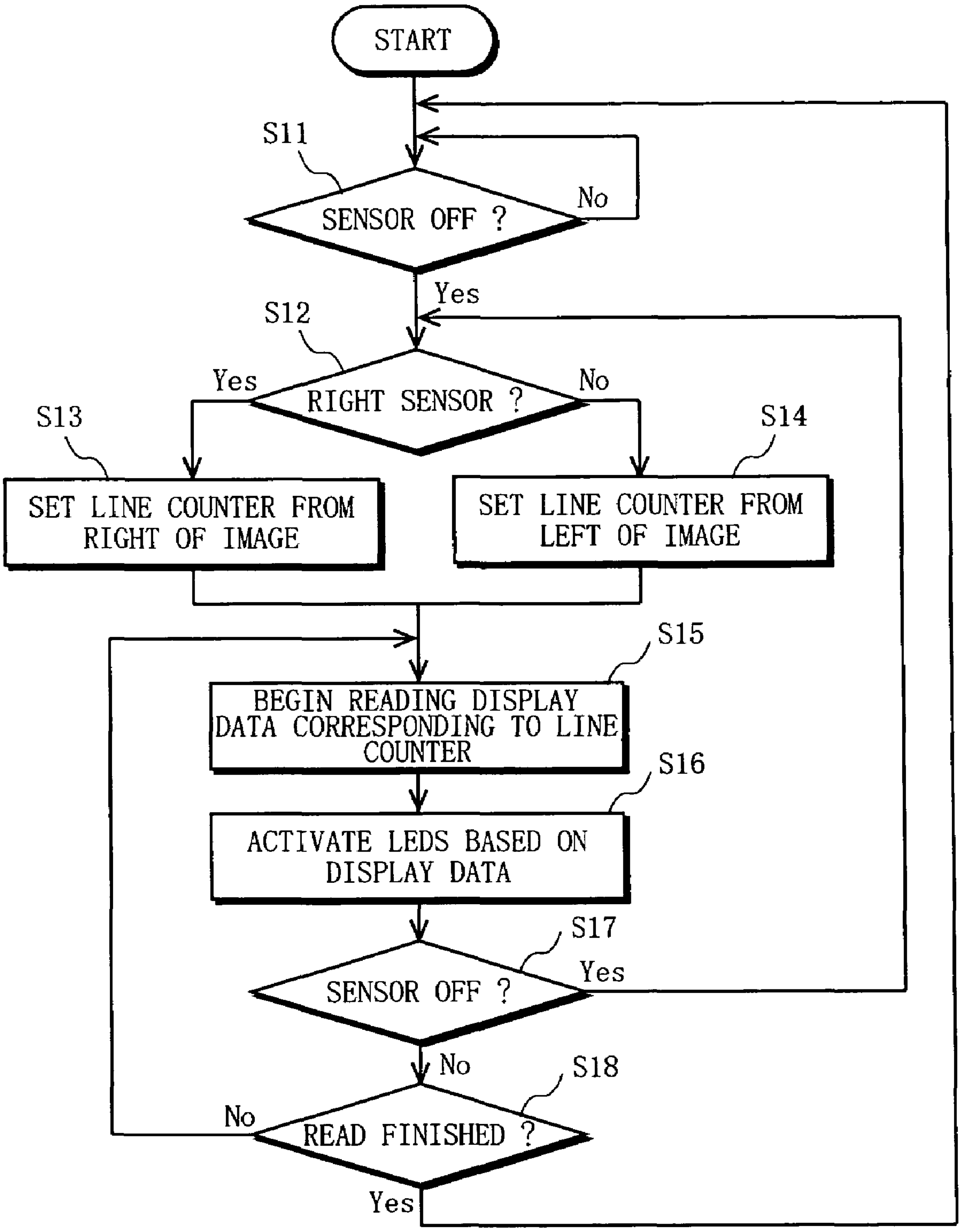
FIG. 14 is a flowchart illustrating the flow of processes performed by a CPU.

Next, referring to the flowchart of FIG. 14, the flow of processes performed by the CPU 51 in the present embodiment will be described. Once the swing-type display device is turned on, the CPU 51 monitors whether the right output or the left output from the tilt sensor 30 has transitioned from ON to OFF (S11). If such a transition has occurred, control proceeds to step S12; otherwise, the CPU 51 keeps monitoring. At step S12, it is determined whether the transition from ON to OFF occurred in the right output from the tilt sensor 30. If the transition from ON to OFF has occurred in the right output, a line counter which consecutively counts the lines from the rightmost end of the image, as indicated in "data read II" of FIG. 7, is set (S13). On the other hand, if it is in the left output from the tilt sensor 30 that the transition from ON to OFF has occurred, a line counter which consecutively counts the lines from the rightmost end of the image, as indicated in "data read I" of FIG. 7, is set (S14).

Once the aforementioned line counter is set, the CPU 51 reads the image data of a line indicated by the line counter (S15) from the ROM 61. Then, pulses in accordance with the image data thus read are output, thereby activating the LEDs 10R and 10G (S16).

At step S17, it is determined whether the right or left output from the tilt sensor 30 has transitioned from ON to OFF. If such a transition has occurred, control returns to step S12; otherwise, control proceeds to step S18. At step S18, the CPU 51 determines whether the data read has been completed for all of the lines in the image data. If the data read is not complete, control returns to step S15, and the process continues with respect to the next line. On the other hand, if the data read has been completed for all of the lines in the image data, control returns to step S11.

Figure 15A:
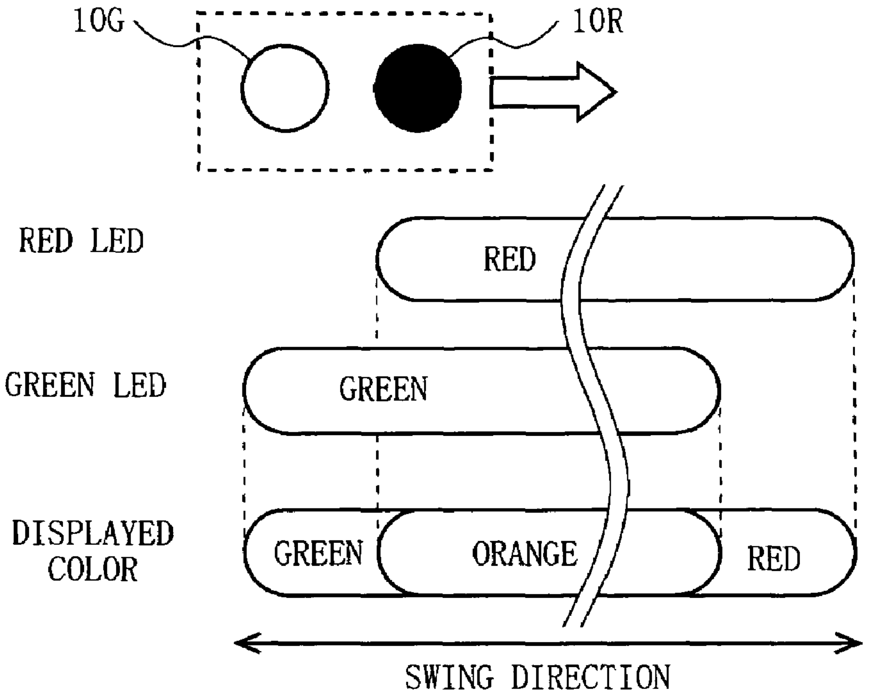
FIGS. 15A and 15B are diagrams illustrating the effects obtained by offsetting the activation timing of a red LED from the activation timing of a green LED.
Figure 15B:
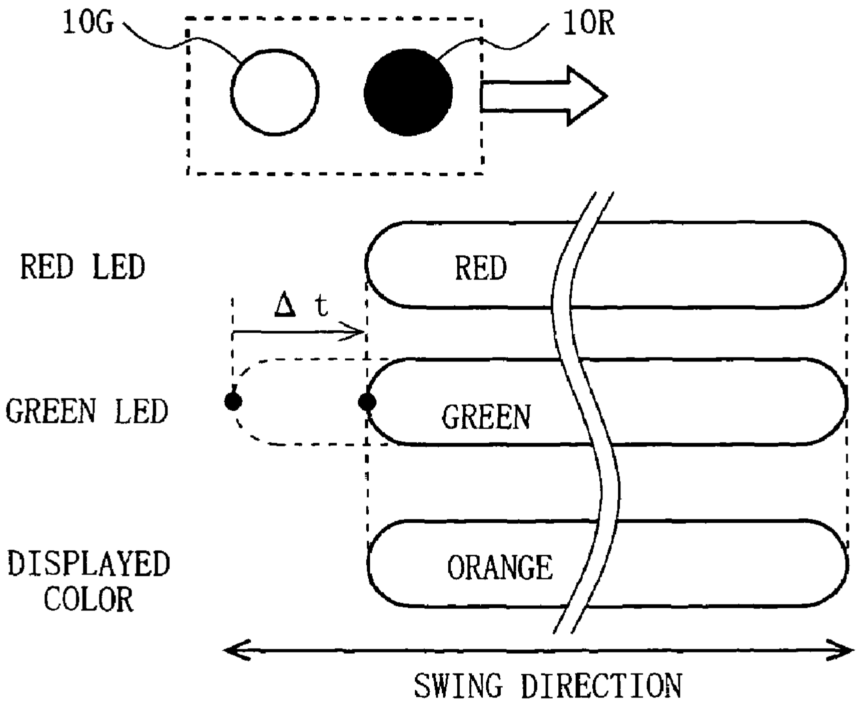

Although the present embodiment illustrates an example where each red LED 10R and each green LED 10G are simultaneously activated in accordance with the image data, the present invention is not limited thereto. The activation timing for the red LEDs 10R and the activation timing for the green LEDs 10G may be purposely offset as necessary. For example, consider a case where an orange color is to be displayed by simultaneously activating a red LED 10R and a green LED 10G. Since the red LED 10R and the green LED 10G are located side by side along the swing direction, there may emerge a gap between the position at which the red LED 10R is activated and the position at which the green LED 10G is activated, as shown in FIG. 15A, resulting in the red and green colors being displayed, in addition to orange. The red and green colors would be particularly conspicuous in the case where each red LED 10R is widely spaced apart from each green LED 10G, or where the LEDs 10R and 10G are mounted on the swing-type display device without any covering means thereon. In order to avoid this problem, as shown in FIG. 15B, the CPU 51 may control each pair of a red LED 10R and a green LED 10G so that the LED which is located more to the rear along the direction of the motion of the swing-type display device (e.g., the green LED 10G)

is activated a predetermined time Δt later than the other LED which is located more to the front along the direction of the swinging motion of the swing-type display device (e.g., the red LED 10R). As a result, it is ensured that the position at which the red LED 10R is activated coincides with the position at which the green LED 10G is activated, whereby an image can be displayed in a more ideal manner.

Figure 16:
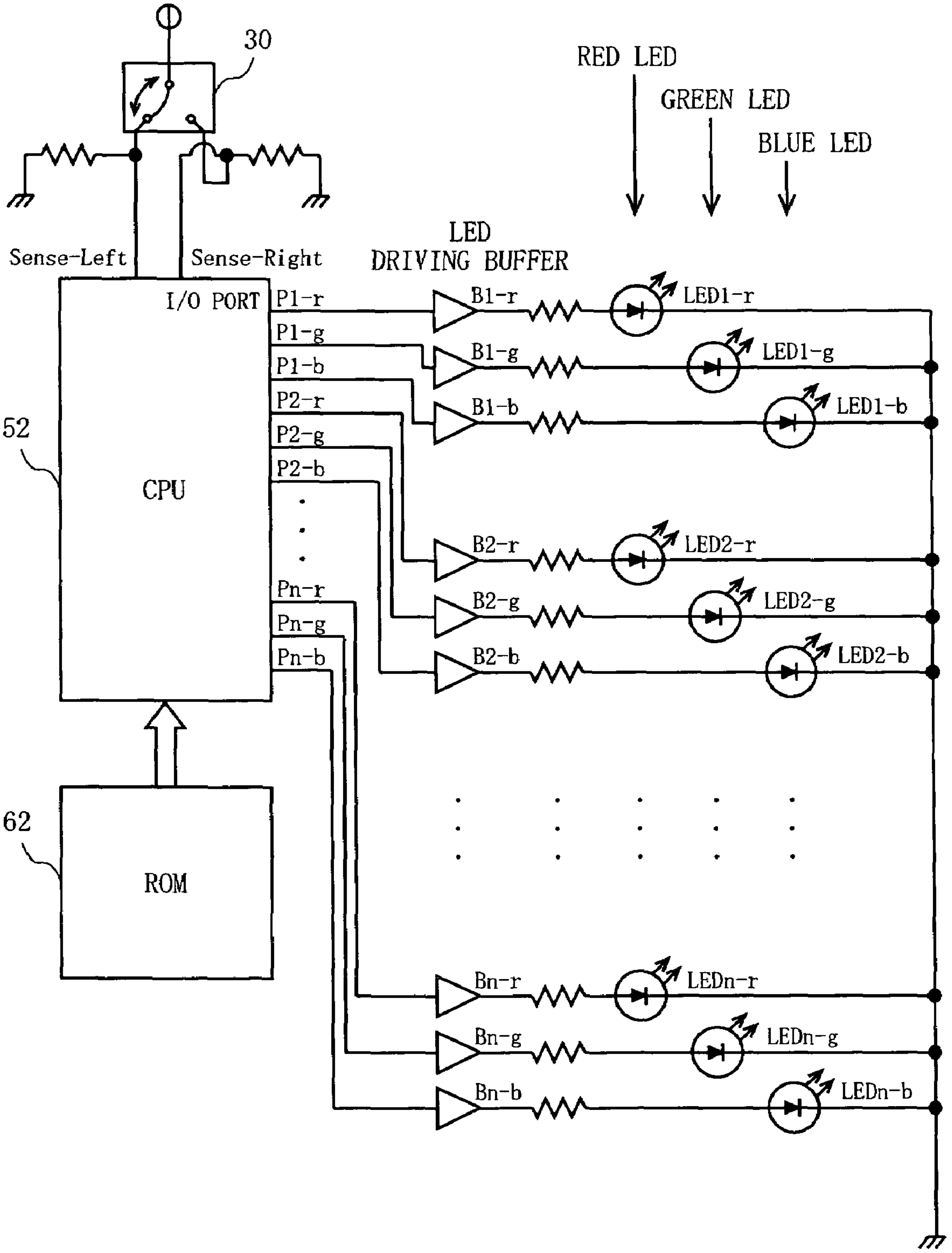
FIG. 16 is a diagram illustrating the internal structure of a swing-type display device according to the illustrative embodiments incorporating three colors of LEDs.

Although the present embodiment illustrates an example where an image is displayed by employing two colors of LEDs, i.e., the red LEDs 10R and the green LEDs 10G, the present invention is not limited thereto. For example, as shown in FIG. 16, three colors (red, green, and blue) LEDs may be employed to display images in a greater variety of colors. In this case, a CPU 52 individually controls red LEDs, the green LED, and the blue LEDs based on the image data stored in a ROM 62. By increasing the number of gray scale levels for each color, a full color display function can be enabled.

Figure 5:
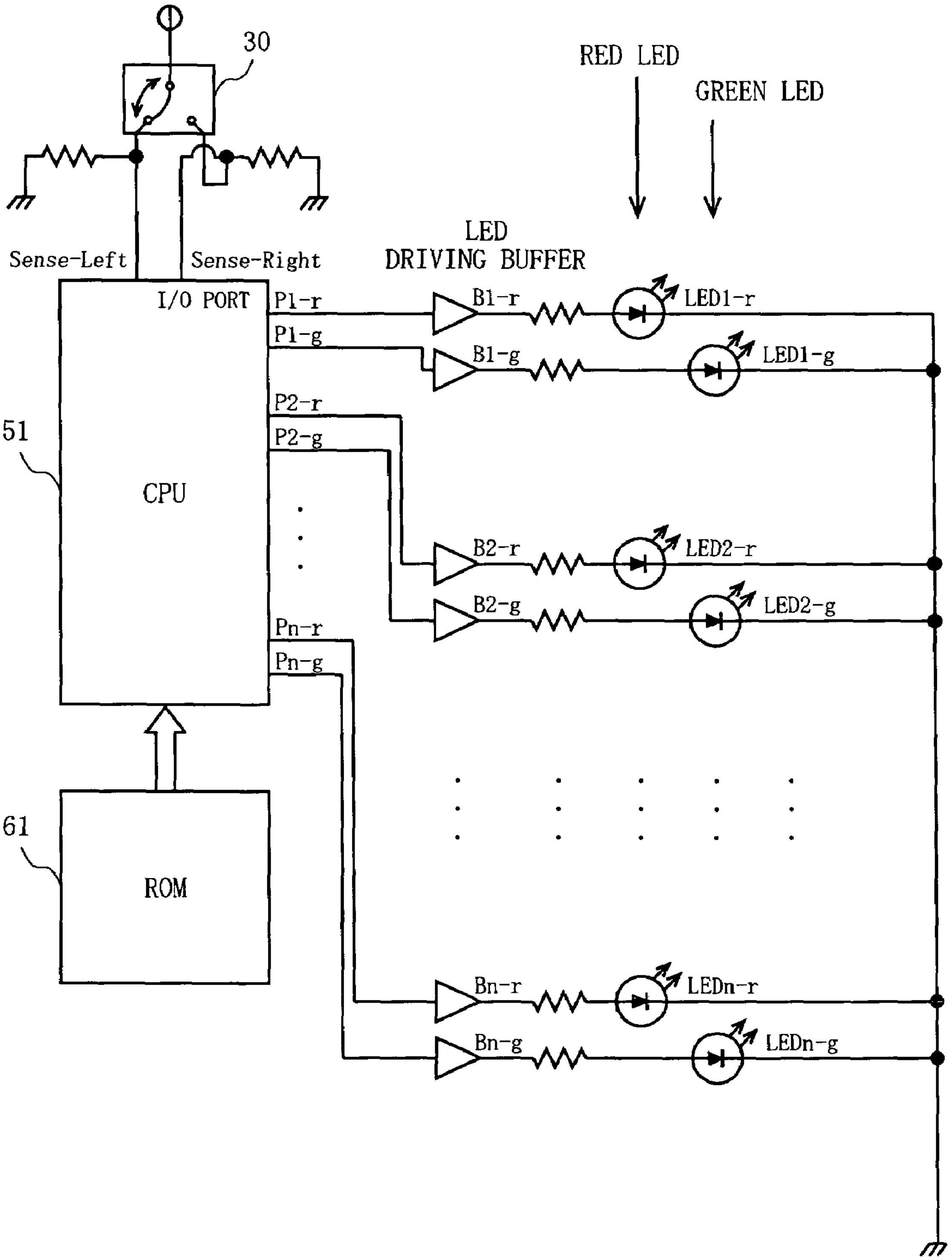
FIG. 5 is a diagram illustrating the internal structure of the swing-type display device of the first embodiment.
Figure 17:
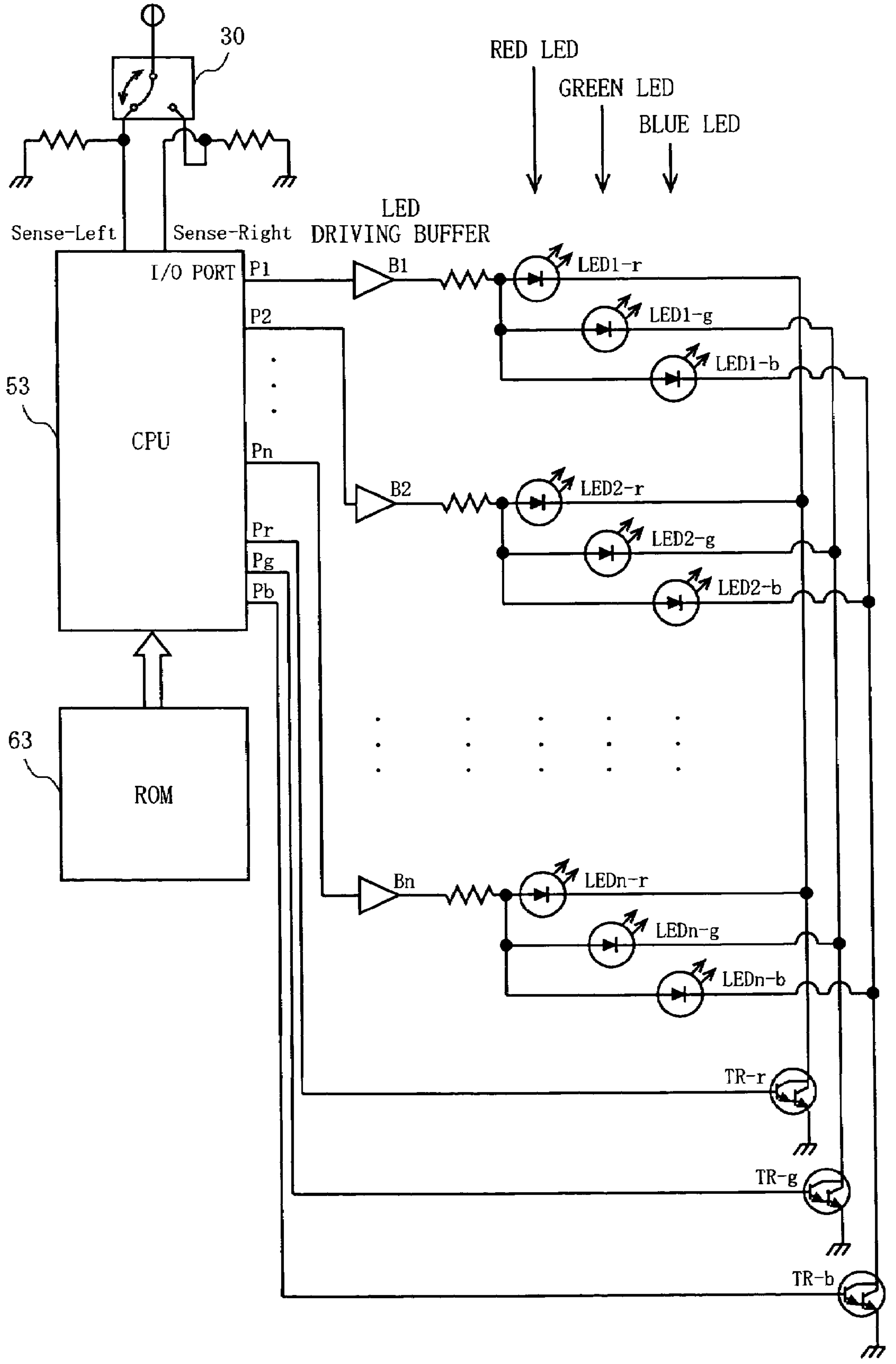
FIG. 17 is a diagram illustrating the internal structure of a swing-type display device according to the illustrative embodiments where the LEDs are driven based on time sharing.

Instead of driving the LEDs by individually providing each LED with a pulse as in the examples illustrated in FIG. 5 or 16, the LEDs may be driven based on time sharing, as shown in FIG. 17. In the example illustrated in FIG. 17, a CPU 53 splits the display time T for each line into a period for activating the red LEDs, a period for activating the green LEDs, and a period for activating the blue LEDs, and the duty ratio of each pulse (P1 to Pn shown in FIG. 17) is varied from period to period in accordance with the image data stored in a ROM 63. As a result, the number of component elements of the swing-type display device can be decreased, thereby reducing the size of the swing-type display device and the cost associated with the production thereof.

Second Embodiment

Next, a second embodiment of the present invention will be described. A major feature of the second embodiment is in that a plurality of partitions and a covering member are provided instead of the optical guide 20 according to the first embodiment, in order to make the stripes which may appear in the displayed image due to the interspaces between the LEDs less conspicuous.

Figure 18:
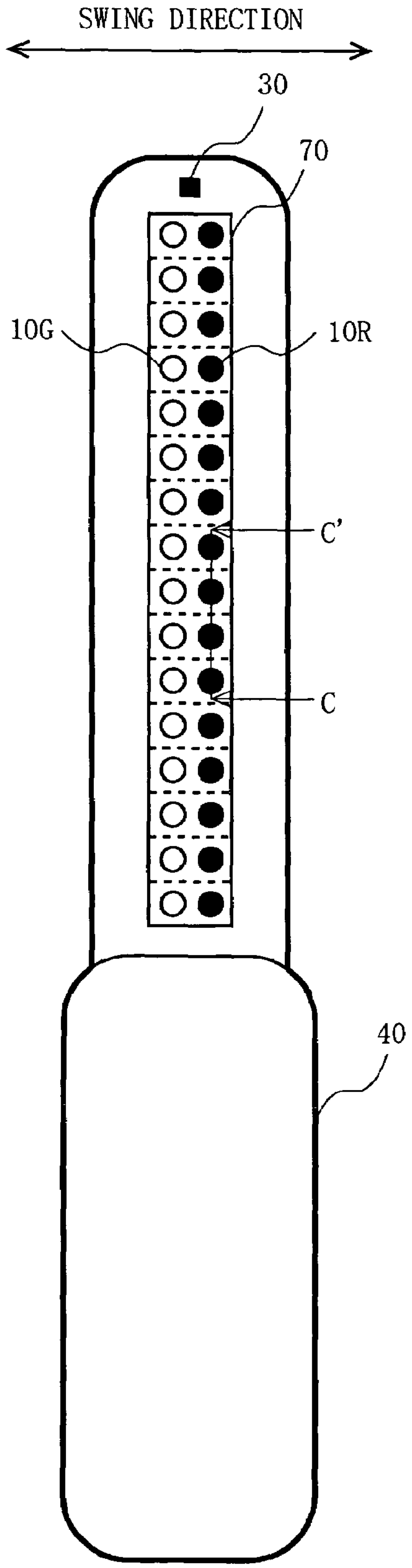
FIG. 18 is an external view showing a swing-type display device according to a second embodiment of the present invention.

FIG. 18 is an external view showing a swing-type display device according to the second embodiment of the present invention. As shown in FIG. 18, the swing-type display device comprises sixteen red LEDs 10R, sixteen green LEDs 10G, a covering member 70, a tilt sensor 30, and a grip portion 40. In FIG. 18, any constituent elements which also appear in FIG. 1 are denoted by like reference numerals, and the descriptions thereof are omitted.

The covering member 70 is composed of a light-transmitting material, e.g., acrylic resin, and is disposed so as to cover the light-emitting surfaces of the red LEDs 10R and the green LEDs 10G.

Figure 19A:
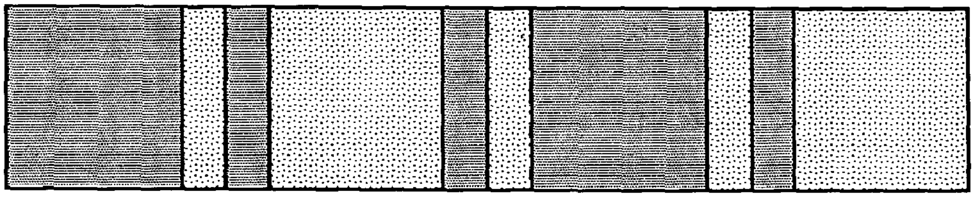
FIGS. 19A and 19B are cross-sectional views illustrating the swing-type display device according to the second embodiment of the present invention.
Figure 19B:
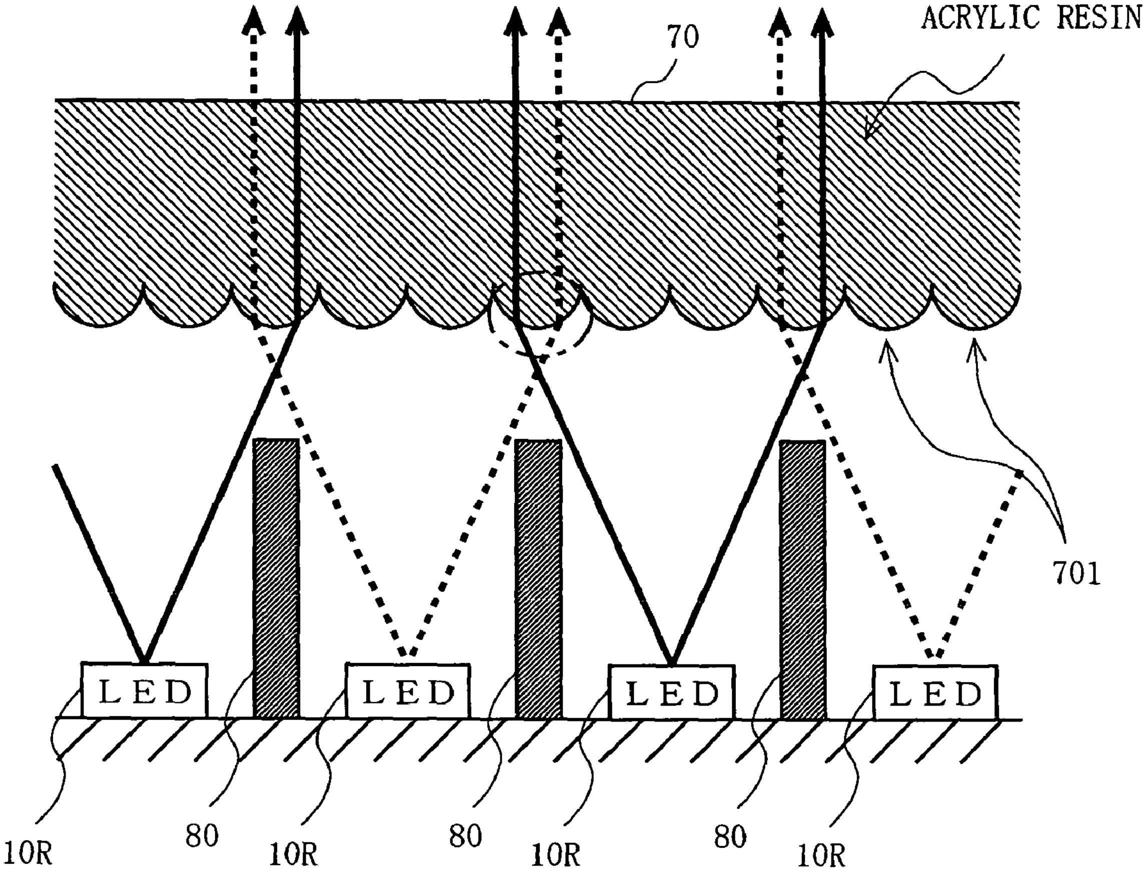

Referring to FIG. 19B, the cross section taken at line C–C' in FIG. 18 will be described.

A partition 80 is provided at the border between two adjoining pairs of red LEDs 10R and green LEDs 10G (each pair consisting of one red LED 10R and one green LED 10G). The partitions 80 are provided in order to restrict the directions in which the light outputted from the light-emitting surfaces of the LEDs 10R and 10G can travel. Preferably, the partitions 80 are made of a material which does not transmit light. It would be even more preferable to select a material and/or color which is highly reflective for the partitions 80. Thus, the light emitted from the LEDs 10R and 10G can be more efficiently output outside of the swing-type display device, thereby enabling a brighter display.

Figure 20:
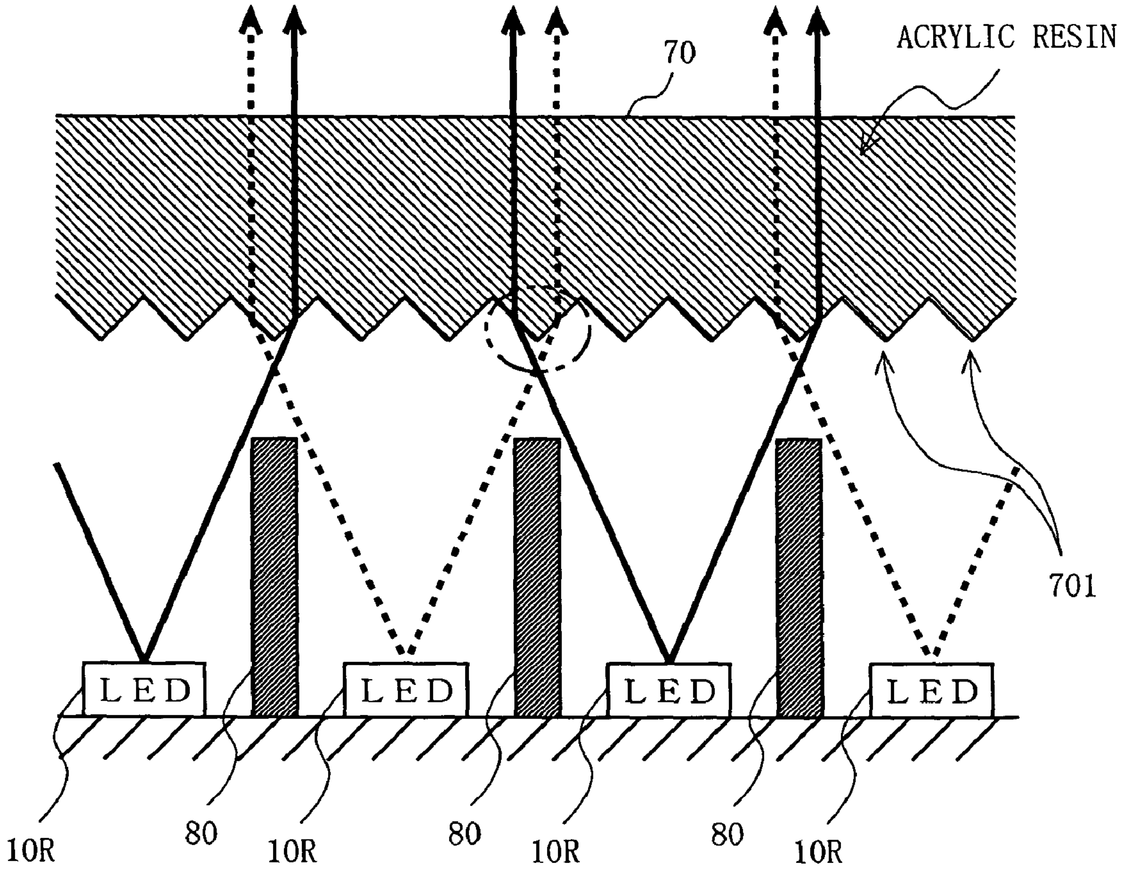
FIG. 20 is a cross-sectional view illustrating a variant of the swing-type display device according to the second embodiment.

On the inner surface of the covering member 70 are formed a plurality of convex portions 701, each convex portion 701 being in the form of a ridge extending along the swing direction. Each convex portion 701 may have a cross section of a lenticular lens as shown in FIG. 19B, for example, although the present invention is not limited thereto. Instead, each convex portion 701 may have a wedge-like cross section as shown in FIG. 20. Using the convex portions 701 having a lenticular-lens-like cross section, however, would be particularly effective because it would allow the optical energy output from the LEDs 10R and 10G to be efficiently used for the display function by preventing it from being wasted.

The covering member 70 is disposed so as to leave a predetermined space from the partitions 80, as shown in FIG. 19B. This ensures that the light output from adjoining LEDs rides over each partition 80 so as to be intermixed to some extent, thereby allowing light to be output to outside of the swing-type display device through regions of the covering member 70 corresponding to the borders between the LED pairs. As a result, the stripes appearing in the displayed image due to the interspaces between the LEDs are made less conspicuous. In particular, since the portions of the inner surface of the covering member 70 that oppose the partitions 80 are shaped into the convex portions 701 shown in FIG. 19B, the light which overrides each partition 80 is refracted by the convex portion 701 so as to be output in a direction perpendicular to the light-emitting surfaces of the LEDs 10R and 10G. As a result, when one views the covering member 70 from outside of the swing-type display device, as shown in FIG. 19A, the light coming from adjoining LEDs appears somewhat intermixed at the borders between LED pairs, thereby rendering the stripes associated with the interspaces between the LEDs even less conspicuous.

Figure 21A:
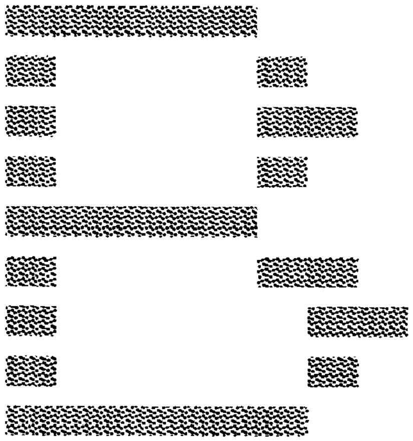
FIGS. 21A, 21B, and 21C are diagrams illustrating the effects obtained according to the second embodiment.
Figure 21B:
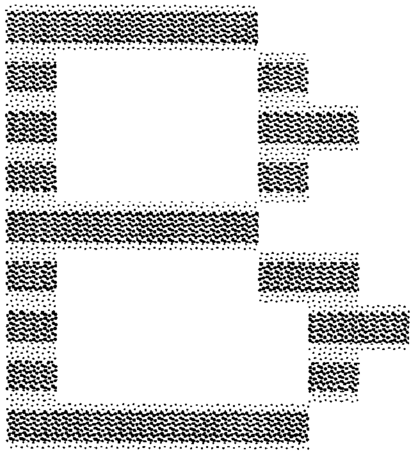
Figure 21C:
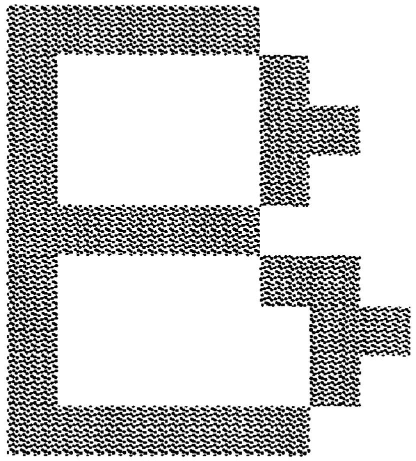

Next, the effects obtained according to the present embodiment will be more specifically described with reference to FIGS. 21A, 21B, and 21C. In a conventional swing-type display device, the portions corresponding to the interspaces between LEDs appear dark as shown in FIG. 21A. On the other hand, when a matte-finished optical guide is provided as described in the first embodiment above, the portions corresponding to the interspaces between LEDs appear lighter as shown in FIG. 21B. However, since this effect is obtained by expanding the brighter portions through diffusion of light (originating from a point source of light) caused by the matte finish, the luminance level decreases toward the borders between LED pairs (i.e., away from the center of the portion opposing each LED). Therefore, as shown in FIG. 21B, the stripes appearing in the displayed image due to the interspaces between the LEDs may not completely be eliminated. In the present embodiment, however, the covering member is provided with a plurality of convex portions formed in the portions opposing the LEDs and the borders between the LED pairs, such that the convex portions directly refract the light originating from the point sources, thereby expanding the brighter portions. As a result, as shown in FIG. 21C, a sufficient luminance level can be obtained even at the borders between LED pairs, the stripes appearing in the displayed image due to the interspaces between the LEDs can be substantially completely eliminated. Incidentally, acrylic resin is known to have a refractive index of about 1.58. Although the present embodiment illustrates an example where plural convex portions are formed for each region opposing an LED pair (i.e., each region of the covering member through which the light from the LED pair is transmitted), a single convex portion may be formed for each such region.

Although the present embodiment illustrates an example where two colors of LEDs, i.e., the red LEDs 10R and green LEDs 10G are employed to display an image, the present invention is not limited thereto. The present embodiment is also applicable to the case where an image is displayed by using a single color of LED (i.e., red LEDs only). In this case, too, the effects according to the present embodiment, i.e., the stripes appearing in the displayed image due to the interspaces between the LEDs being made less conspicuous, can be obtained, as will be appreciated from the above description.

Figure 22:
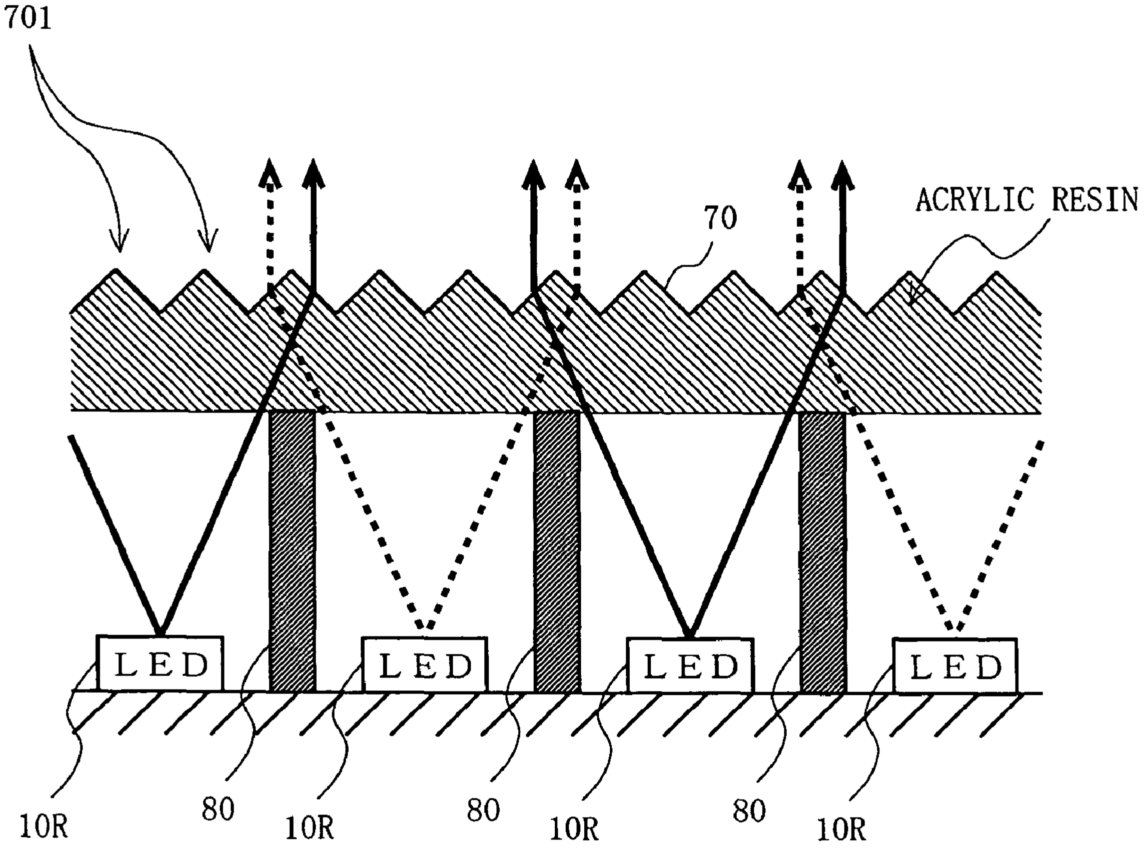
FIG. 22 is a cross-sectional view illustrating another variant of the swing-type display device according to the second embodiment.

Although the present embodiment illustrates an example where a plurality of convex portions 701 are provided on the inner surface of the covering member 70, the present invention is not limited thereto. As shown in FIG. 22, a plurality of convex portions 701 may be provided on the outer surface of the covering member 70. In this case, it is not necessary to leave a predetermined space between the covering member 70 and the partitions 80. The height of the partitions 80 should be determined so as to allow the light from the LEDs 10R and 10G to be appropriately output through the borders between LED pairs, while also taking into consideration the thickness of the covering member 70 from the LEDs 10R and 10G.

While the invention has been described in detail, the foregoing description is in all aspects illustrative and not restrictive. It is understood that numerous other modifications and variations can be devised without departing from the scope of the invention.

What is claimed is:

1. A swing-type display device for displaying, when swung, an image in a trajectory of the swing, by utilizing persistence of vision, comprising:

a linear array of first light-emitting elements, capable of emitting light in a predetermined color, the linear array extending in a direction substantially perpendicular to the direction of the swing;

a linear array of second light-emitting elements, capable of emitting light in a color which is different from the predetermined color, the first light-emitting elements and the second light-emitting elements being arranged in pairs of two, such that each second light-emitting element is disposed near a corresponding one of the first light-emitting elements; and a control section which activates each of the first and second light-emitting elements, for a predetermined period, to emit light in a luminance level in accordance with image data, thereby displaying an image, corresponding to the image data, in the trajectory of the swing, the displayed image appearing as a mixed color formed from the predetermined color of the emitted light from the first light-emitting elements and the color of the emitted light from the second light-emitting elements.

2. The swing-type display device according to claim 1, wherein the predetermined period is equal to a period for displaying a single pixel of the image.

3. The swing-type display device according to claim 1, wherein the first and second light-emitting elements of each pair are located side by side in the direction of the swing.

4. The swing-type display device according to claim 3, wherein the control section is operable to control one of the first and second light-emitting elements of each pair which is located more to a rear along the direction of the swing of the swing-type display device, to be activated a predetermined time later than the other light-emitting element which is located more to a front along the direction of the swing of the swing-type display device.

5. The swing-type display device according to claim 1, wherein each of the control section is operable to drive each of the first and second light-emitting elements is a light-emitting element driven by a respective PWM signal, and the mixed color results from the respective PWM signals driving the first and second light-emitting elements.

6. The swing-type display device according to claim 5, further comprising a data table storing a correspondence between duty ratios of respective PWM signals driving the first and second light-emitting elements and the mixed color to be displayed.

7. The swing-type display device according to claim 1, wherein each of the first and second light-emitting elements is a light-emitting element driven by a respective variable current or voltage signal, and the mixed color results from levels of the respective variable current or voltage signals driving the first and second light-emitting elements.

8. A swing-type display device for displaying, when swung, an image in a trajectory of the swing, by utilizing persistence of vision, comprising:

a linear array of first light-emitting elements, capable of emitting light in a predetermined color, the linear array extending in a direction substantially perpendicular to the direction of the swing;

a linear array of second light-emitting elements, capable of emitting light in a color which is different from the predetermined color, the first light-emitting elements and the second light-emitting elements being arranged in pairs of two, such that each second light-emitting element is disposed near a corresponding one of the first light-emitting elements;

a control section which activates each of the first and second light-emitting elements, for a predetermined period, to emit light in a luminance level in accordance with image data, thereby displaying an image, corresponding to the image data, in the trajectory of the swing; and a tilt sensor which detects a tilt of the swing-type display device, wherein the tilt sensor includes a ball which is capable of reciprocating between a first position and a second position in synchronization with the swing of the swing-type display device, and the control section is operable to begin activating each of the first and second light-emitting elements each time the ball is moved out of the first or second position.

9. A swing-type display device for displaying, when swung, an image in a trajectory of the swing, by utilizing persistence of vision, comprising:

a linear array of first light-emitting elements, capable of emitting light in a predetermined color, the linear array extending in a direction substantially perpendicular to the direction of the swing;

a linear array of second light-emitting elements, capable of emitting light in a color which is different from the predetermined color, the first light-emitting elements and the second light-emitting elements being arranged in pairs of two, such that each second light-emitting element is disposed near a corresponding one of the first light-emitting elements;

a control section which activates each of the first and second light-emitting elements, for a predetermined period, to emit light in a luminance level in accordance with image data, thereby displaying an image, corresponding to the image data, in the trajectory of the swing; and comprising a light-transmitting material, the optical guide covering light-emitting surfaces of the first and second light-emitting elements and allowing the light emitted from the light-emitting surfaces of the first and second light-emitting elements to propagate therethrough to outside of the swing-type display device, wherein the optical guide includes a first face opposing the light-emitting surfaces of the first and second light-emitting elements, and a second face opposite from the first face, the second face being matte-finished to diffuse the light propagating through the optical guide.

10. The swing-type display device according to claim 9, wherein a groove is formed, on the first face of the optical guide, in a position opposing each boundary between adjacent pairs of first and second light-emitting elements.

11. A swing-type display device for, when swung, displaying an image in a trajectory of the swing by utilizing persistence of vision, comprising:

a linear array of light-emitting elements, the linear array extending in a direction substantially perpendicular to the direction of the swing;

a control section for activating each of the light-emitting elements for a predetermined period, to emit light in a luminance level in accordance with image data, thereby displaying an image, corresponding to the image data, in the trajectory of the swing;

partitions, each provided between adjacent ones of the light-emitting elements, for restricting directions of light output from light-emitting surfaces of the light-emitting elements; and a covering member provided to cover the light-emitting elements and the partitions, the covering member comprising a light-transmitting material, wherein, the covering member includes a first face opposing the light-emitting surfaces of the light-emitting elements, and a second face opposite from the first face, and the swing-type display device further comprises a plurality of convex portions, formed on at least one of the first and second faces, each shaped as a ridge extending along the direction of the swing.

12. The swing-type display device according to claim 11, wherein the convex portion has a lenticular-lens-like or wedge-like configuration.

13. The swing-type display device according to claim 12, wherein a plurality of said partitions are formed in a light-emitting area, on the second face, which is attributable to each of the light-emitting elements.

14. The swing-type display device according to claim 11, wherein, the convex portions are formed on the first face, and the covering member is disposed so as to leave a predetermined space between the covering member and the partitions.

15. The swing-type display device according to claim 14, wherein the convex portions are formed at least on portions of the first face opposing the partitions.

16. The swing-type display device according to claim 11, wherein the predetermined period is equal to a period for displaying a single pixel of the image.

17. The swing-type display device according to claim 11, wherein, the control section is operable to drive each of the light-emitting elements for the predetermined period, by a PWM technique using a pulse having a frequency based on the image data, and the frequency takes at least three values in accordance with the image data.

18. The swing-type display device according to claim 11, wherein, the control section is operable to drive each of the light-emitting elements for the predetermined period, with a current or voltage based on the image data, and the current or voltage takes at least three values in accordance with the image data.

19. The swing-type display device according to claim 11, further comprising a tilt sensor which detects a tilt of the swing-type display device, wherein, the tilt sensor includes a ball which is capable of reciprocating between a first position and a second positions in synchronization with the swing of the swing-type display device, and the control section is operable to begin activating each of the light-emitting elements each time the ball is moved out of the first or second position.

20. A method for displaying, by utilizing persistence of vision, an image in a trajectory of a swing of a swung swing-type display device, comprising:

providing a plurality of light-emitting element sets, each of which comprises a plurality of light-emitting elements, each of the plurality of elements in a set being disposed near the each of the other of the plurality of elements in the set, the plurality of light-emitting element sets being aligned in a linear array of sets substantially perpendicular to the swing direction;

providing a control section which activates each light-emitting element of each set, for a predetermined period, to emit light in a luminance level in accordance with image data; and causing each light-emitting element of each set, for a predetermined period, to emit light in a luminance level in accordance with the image data, thereby displaying an image, corresponding to the image data, in the trajectory of the swing, the displayed image appearing as a mixed color formed from a first color of emitted light from light-emitting elements of one of the plurality of light-emitting element sets and a second color which is different from the first color, of emitted light from light-emitting elements of another one of the plurality of light-emitting element sets.

21. The method according to claim 20, wherein the predetermined period is equal to a period for displaying a single pixel of the image.

22. The method according to claim 20, wherein the control section is operable to drive each of the light-emitting elements in each set for the predetermined period by a PWM technique using a pulse having a frequency based on the image data to display the image; and the frequency takes at least two values in accordance with the image data.

23. The method according to claim 20, wherein the control section drives each of the light-emitting elements of each set for the predetermined period with a current or voltage based on the image data to display the image; and the current or voltage takes at least two values in accordance with the image data.

24. The method according to claim 20, wherein the control section is operable to control one of the light-emitting elements of each set which is located more to a rear along the direction of the swing of the swing-type display device, to be activated a predetermined time later than another light-emitting element which is located more to a front along the direction of the swing of the swing-type display device.

25. A method for displaying, by utilizing persistence of vision, an image in a trajectory of a swing of a swung swing-type display device, comprising:

providing a plurality of light-emitting element sets, each of which comprises a plurality of light-emitting elements, each of the plurality of elements in a set being disposed near the each of the other of the plurality of elements in the set, and the plurality of light-emitting element sets being aligned in a linear array of sets substantially perpendicular to the swing direction;

providing a control section which activates each light-emitting element of each set, for a predetermined period, to emit light in a luminance level in accordance with image data;

causing each light-emitting element of each set, for a predetermined period, to emit light in a luminance level in accordance with the image data, thereby displaying an image, corresponding to the image data, in the trajectory of the swing; and providing an optical guide comprising a light-transmitting material, the optical guide covering light-emitting surfaces of the light-emitting elements in each set and allowing the light emitted from the light-emitting surfaces of the light-emitting elements to propagate therethrough to outside of the swing-type display device, wherein the optical guide includes a first face opposing the light-emitting surfaces of the light-emitting elements, and a second face opposite from the first face, the second face being matte-finished to diffuse the light propagating through the optical guide.

26. The method according to claim 25, further comprising forming a groove on the first face of the optical guide, in a position opposing each boundary between adjacent sets of light-emitting elements.

27. A method for displaying, by utilizing persistence of vision, an image in a trajectory of a swing of a swung swing-type display device, comprising:

providing a plurality of light-emitting element sets, each of which comprises a plurality of light-emitting elements, each of the plurality of elements in a set being disposed near the each of the other of the plurality of elements in the set, and the plurality of light-emitting element sets being aligned in a linear array of sets substantially perpendicular to the swing direction;

providing a control section which activates each light-emitting element of each set, for a predetermined period, to emit light in a luminance level in accordance with image data;

causing each light-emitting element of each set, for a predetermined period, to emit light in a luminance level in accordance with the image data, thereby displaying an image, corresponding to the image data, in the trajectory of the swing providing a tilt sensor which detects a tilt of the swing-type display device; and wherein the tilt sensor includes a ball which is capable of reciprocating between a first position and a second position in synchronization with the swing of the swing-type display device, and the control section is operable to begin activating each of the light-emitting elements of each set, each time the ball is moved out of the first or second position.

28. A swing-type display device for displaying, when swung, an image in a trajectory of the swing, by utilizing persistence of vision, comprising:

a linear array of first light-emitting elements, capable of emitting light in a predetermined color, the linear array extending in a direction substantially perpendicular to the direction of the swing;

a linear array of second light-emitting elements, capable of emitting light in a color which is different from the predetermined color, the first light-emitting elements and the second light-emitting elements being arranged in pairs of two, such that each second light-emitting element is disposed near a corresponding one of the first light-emitting elements; and a control section which activates each of the first and second light-emitting elements, for a predetermined period, to emit light in a luminance level in accordance with image data, thereby displaying an image, corresponding to the image data, in the trajectory of the swing, the image displayed having multiple colors.

29. The swing-type display device according to claim 28, wherein each of the first and second light-emitting elements is a light-emitting element driven by a respective PWM signal, and the multiple colors result from the respective PWM signals driving the first and second light-emitting elements.

30. The swing-type display device according to claim 29, further comprising a data table storing a correspondence between duty ratios of respective PWM signals driving the first and second light-emitting elements and the mixed color to be displayed.

31. The swing-type display device according to claim 28, wherein each of the first and second light-emitting elements is a light-emitting element driven by a respective variable current or voltage signal, and the multiple colors result from levels of the respective variable current or voltage signals driving the first and second light-emitting elements.

32. A method for displaying, by utilizing persistence of vision, an image in a trajectory of a swing of a swung swing-type display device, comprising:

providing a plurality of light-emitting element sets, each of which comprises a plurality of light-emitting elements, each of the plurality of elements in a set being disposed near the each of the other of the plurality of elements in the set, and the plurality of light-emitting element sets being aligned in a linear array of sets substantially perpendicular to the swing direction;

providing a control section which activates each light-emitting element of each set, for a predetermined period, to emit light in a luminance level in accordance with image data; and causing each light-emitting element of each set, for a predetermined period, to emit light in a luminance level in accordance with the image data, thereby displaying an image, corresponding to the image data, in the trajectory of the swing, the image displayed having multiple colors.

33. The method according to claim 32, wherein the control section is operable to drive each of the light-emitting elements in each set for the predetermined period, by a PWM technique using a pulse having a frequency based on the image data to display the image; and the frequency takes at least two values in accordance with the image data.

34. The method according to claim 32, wherein the control section drives each of the light-emitting elements of each set for the predetermined period, with a current or voltage based on the image data to display the image; and the current or voltage takes at least two values in accordance with the image data.

* * * * *